(12) United States Patent
English et al.

(10) Patent No.: US 10,965,333 B2
(45) Date of Patent: *Mar. 30, 2021

(54) THERMAL MANAGEMENT ASSEMBLIES SUITABLE FOR USE WITH TRANSCEIVERS AND OTHER DEVICES

(71) Applicant: Laird Technologies, Inc., Chesterfield, MO (US)

(72) Inventors: Gerald R. English, Glen Ellyn, IL (US); Joseph C. Boetto, Hoffman Estates, IL (US); Woongho Bang, Palatine, IL (US); Leonid Lev Shmagin, Round Lake, IL (US); Jason L. Strader, Cleveland, OH (US); Eugene Anthony Pruss, Avon Lake, OH (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/543,807

(22) Filed: Aug. 19, 2019

(65) Prior Publication Data

US 2019/0379417 A1    Dec. 12, 2019

Related U.S. Application Data

(63) Continuation-in-part of application No. 15/657,966, filed on Jul. 24, 2017, now Pat. No. 10,389,397.
(Continued)

(51) Int. Cl.
*H04B 1/38* (2015.01)
*F25B 21/02* (2006.01)
(Continued)

(52) U.S. Cl.
CPC ............... *H04B 1/38* (2013.01); *F25B 21/02* (2013.01); *G02B 6/4269* (2013.01);
(Continued)

(58) Field of Classification Search
CPC ...... H04B 1/38; H04B 1/036; H01R 13/2457; H01R 13/6591; H01R 13/6594;
(Continued)

(56) References Cited

U.S. PATENT DOCUMENTS

| | | |
|---|---|---|
| 4,934,965 A | 6/1990 | Buddrus |
| 6,097,598 A | 8/2000 | Miyahara et al. |

(Continued)

FOREIGN PATENT DOCUMENTS

| | | |
|---|---|---|
| CN | 201976133 U | 9/2011 |
| CN | 103797903 B | 1/2016 |

(Continued)

OTHER PUBLICATIONS

Williams, Jim; A Thermoelectric Cooler Temperature Controller for Fiber Optic Lasers, Application Note 89, Apr. 2001, 11 pages.
(Continued)

*Primary Examiner* — Travis S Chambers
(74) *Attorney, Agent, or Firm* — Harness, Dickey & Pierce, P.L.C.; Anthony G. Fussner

(57) ABSTRACT

Exemplary embodiments are disclosed of thermal management assemblies suitable for use (e.g., configured for heat spreading, etc.) with transceivers (e.g., small form-factor pluggable (SFP) transceivers, SFP+ transceivers, quad small form-factor pluggable (QSFP) transceivers QSFP+ transceivers, XFP transceivers, etc.) and other devices (e.g., memory card readers, etc.). In exemplary embodiments, a thermal management assembly comprises at least one flexible heat spreading material (e.g., a single graphite sheet, multiple graphite sheets, etc.) including portions wrapped
(Continued)

(e.g., in different non-parallel directions, in parallel directions, etc.) around corresponding portions of a part, which may be configured to be coupled to and/or along a side of a device housing. The at least one flexible heat spreading material may be operable for defining at least a portion of a thermally-conductive heat path around the corresponding portions of the part.

20 Claims, 21 Drawing Sheets

Related U.S. Application Data

(60) Provisional application No. 62/731,020, filed on Sep. 13, 2018, provisional application No. 62/747,589, filed on Oct. 18, 2018, provisional application No. 62/367,021, filed on Jul. 26, 2016.

(51) Int. Cl.
*G02B 6/42* (2006.01)
*H01R 13/24* (2006.01)
*H05K 5/02* (2006.01)
*H05K 7/20* (2006.01)
*H01R 13/6591* (2011.01)
*H04B 1/036* (2006.01)

(52) U.S. Cl.
CPC ..... *H01R 13/2457* (2013.01); *H01R 13/6591* (2013.01); *H04B 1/036* (2013.01); *H05K 5/0247* (2013.01); *H05K 7/20418* (2013.01); *F25B 2321/023* (2013.01); *F25B 2321/0251* (2013.01)

(58) Field of Classification Search
CPC ............ H05K 5/0247; H05K 7/20418; H05K 1/0203; H05K 7/20; H05K 7/20154; H05K 1/0201; F25B 21/02; F25B 2321/023; F25B 2321/0251; G02B 6/4269
USPC ................................. 439/487, 485
See application file for complete search history.

(56) References Cited

U.S. PATENT DOCUMENTS

| | | | |
|---|---|---|---|
| 6,309,742 B1 | 10/2001 | Clupper et al. | |
| 6,410,137 B1 | 6/2002 | Bunyan | |
| 6,521,348 B2 | 2/2003 | Bunyan et al. | |
| 6,784,363 B2 | 8/2004 | Jones | |
| 6,821,030 B2 | 11/2004 | Fukuda et al. | |
| 6,835,453 B2 | 12/2004 | Greenwood et al. | |
| 7,131,859 B1 | 11/2006 | Zumbrunnen | |
| 7,135,643 B2 | 11/2006 | van Haaster et al. | |
| 7,161,809 B2 | 1/2007 | Ford et al. | |
| 7,292,441 B2 | 11/2007 | Smalc et al. | |
| 7,317,742 B2 | 1/2008 | Saito et al. | |
| 7,326,862 B2 | 2/2008 | Lionetta et al. | |
| 7,355,857 B2 | 4/2008 | Pirillis et al. | |
| 7,852,633 B2 | 12/2010 | Ito | |
| 7,889,502 B1 | 2/2011 | Reis et al. | |
| 7,974,098 B2 | 7/2011 | Oki et al. | |
| 8,599,559 B1 | 12/2013 | Morrison et al. | |
| 8,758,892 B2 | 6/2014 | Bergin et al. | |
| 8,885,342 B2 | 11/2014 | Skepnek | |
| 9,052,483 B2 | 6/2015 | Nguyen | |
| 9,255,703 B2 | 2/2016 | Auyeung et al. | |
| 9,335,104 B2 | 5/2016 | Oh et al. | |
| 9,368,887 B2 | 6/2016 | Ekstedt et al. | |
| 9,869,837 B2 | 1/2018 | Morgan | |
| 10,249,983 B2 * | 4/2019 | Regnier | H05K 7/20509 |
| 10,389,397 B2 * | 8/2019 | Edgren | H04B 1/036 |
| 2006/0128221 A1 | 6/2006 | Yoshikawa et al. | |
| 2006/0180348 A1 | 8/2006 | Cloutier et al. | |
| 2007/0052125 A1 | 3/2007 | Kalinoski et al. | |
| 2008/0150747 A1 | 6/2008 | Eren | |
| 2010/0027220 A1 | 2/2010 | Hughes et al. | |
| 2010/0039775 A1 | 2/2010 | Lima | |
| 2010/0178783 A1 | 7/2010 | Bright et al. | |
| 2012/0033384 A1 | 2/2012 | Pillai | |
| 2012/0052720 A1 * | 3/2012 | David | H01R 13/6595 |
| | | | 439/487 |
| 2012/0061135 A1 | 3/2012 | Hill et al. | |
| 2012/0202370 A1 * | 8/2012 | Mulfinger | H01R 12/737 |
| | | | 439/329 |
| 2013/0048262 A1 | 2/2013 | Ofoma et al. | |
| 2013/0210269 A1 * | 8/2013 | Neer | H05K 7/20145 |
| | | | 439/487 |
| 2014/0332193 A1 | 11/2014 | Oh et al. | |
| 2015/0296638 A1 | 10/2015 | Wu et al. | |
| 2015/0359134 A1 | 12/2015 | Soong et al. | |
| 2018/0034492 A1 | 2/2018 | Edgren et al. | |

FOREIGN PATENT DOCUMENTS

| | | |
|---|---|---|
| EP | 1680274 A2 | 7/2006 |
| JP | 2007184392 A | 7/2007 |
| KR | 2009028283 | 3/2009 |
| KR | 10-1228603 B1 | 1/2013 |
| KR | 10-1245164 B1 | 3/2013 |

OTHER PUBLICATIONS

TgonTM 9000, High Thermal Conductive Graphite Sheet Preliminary, www.lairdtech.com/thermal, Copyright 2014, 2 pages.
European Search Report dated Nov. 2, 2017 for European application No. 17183352 filed Jul. 26, 2017 which claims priority to the instant application; 9 pages.

* cited by examiner

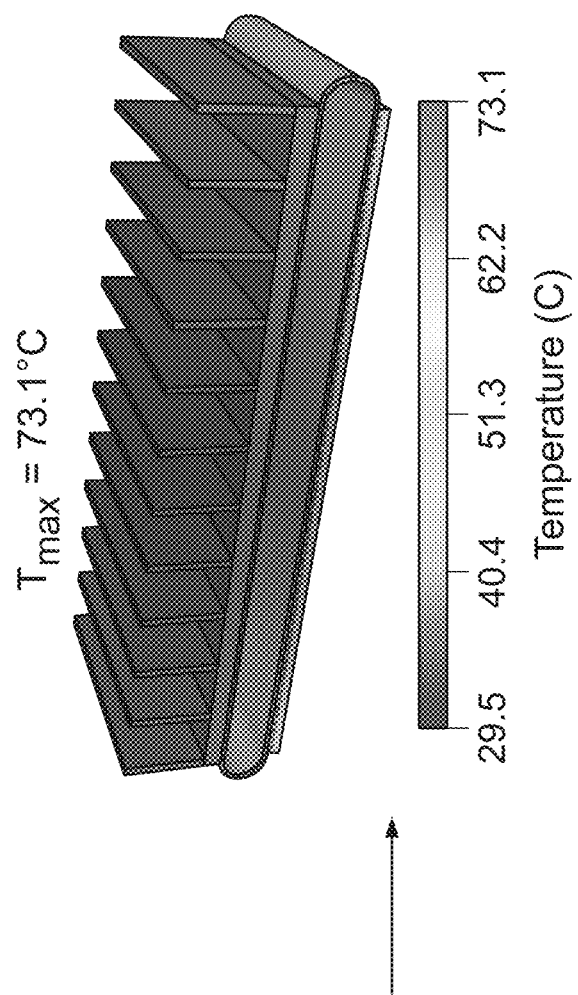
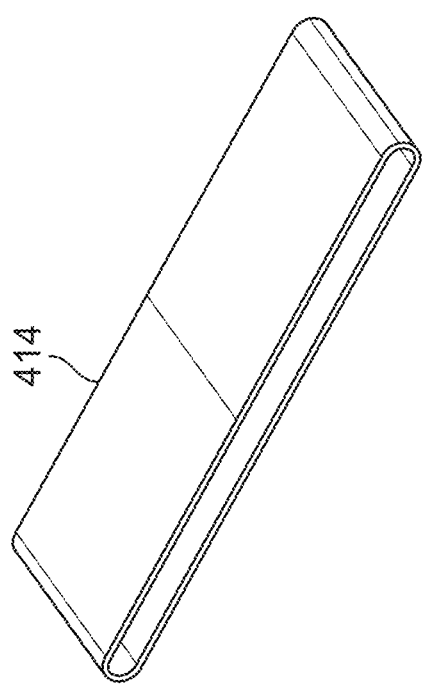
FIG. 19

THERMAL MANAGEMENT ASSEMBLIES SUITABLE FOR USE WITH TRANSCEIVERS AND OTHER DEVICES

CROSS-REFERENCE TO RELATED APPLICATIONS

This application claims the benefit of and priority to U.S. Provisional Application No. 62/731,020 filed Sep. 13, 2018.

This application claims the benefit of and priority to U.S. Provisional Application No. 62/747,589 filed Oct. 18, 2018.

This application is a continuation-in-part of U.S. Non-Provisional patent application Ser. No. 15/657,966 filed Jul. 24, 2017, which published as US2018/0034492 on Feb. 1, 2018 and issues as U.S. Pat. No. 10,389,397 on Aug. 20, 2019.

U.S. NonProvisional patent application Ser. No. 15/657,966 claims the benefit of and priority to U.S. Provisional Application No. 62/367,021 filed Jul. 26, 2016.

The entire disclosures of the above applications are incorporated herein by reference.

FIELD

The present disclosure generally relates to thermal management assemblies suitable for use (e.g., configured for heat spreading, etc.) with transceivers (e.g., small form-factor pluggable (SFP) transceivers, SFP+ transceivers, quad small form-factor pluggable (QSFP) transceivers QSFP+ transceivers, XFP transceivers, etc.) and other devices (e.g., memory card readers, etc.).

BACKGROUND

This section provides background information related to the present disclosure which is not necessarily prior art.

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

By way of further background, small form-factor pluggable (SFP) transceivers may be compact, hot-pluggable transceivers used for telecommunications, data communications applications, etc. A SFP transceiver may interface a network device motherboard (e.g., for a switch, router, media converter, etc.) to a fiber optic or copper networking cable. SFP transceivers may support communications standards including SONET, gigabit Ethernet, Fibre Channel, etc. As used herein, small form-factor pluggable (SFP) also includes other small-form factor pluggables, such as SFP+, quad small form-factor pluggable (QSFP), QSFP+, etc.

DRAWINGS

The drawings described herein are for illustrative purposes only of selected embodiments and not all possible implementations, and are not intended to limit the scope of the present disclosure.

FIG. 19 illustrates the thermal simulation results using the model shown in FIG. 18 along with the wrapped graphite sheet according to the illustrated embodiment shown in FIGS. 10 and 11.

Corresponding reference numerals indicate corresponding (although not necessarily identical) parts throughout the several views of the drawings.

DETAILED DESCRIPTION

Figure 1:
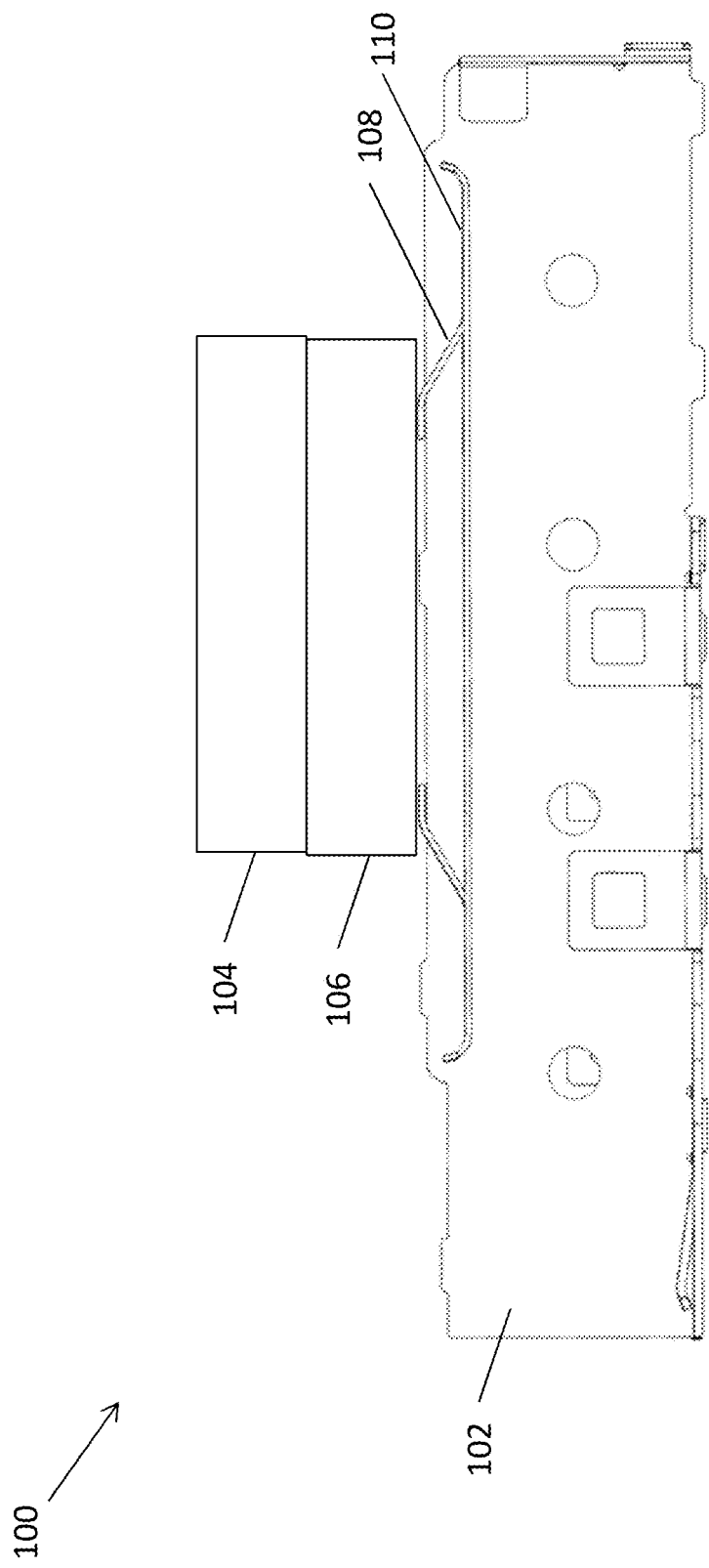
FIG. 1 is a cross-sectional side view of a small form-factor pluggable (SFP) transceiver according to an exemplary embodiment.

Example embodiments will now be described more fully with reference to the accompanying drawings.

There is a demand for increasing numbers of connected devices with increasing speed expectations, combined with physically smaller base stations, may result in higher base station temperatures. Small form-factor pluggable (e.g., SFP, SFP+, QSFP, QSFP+, etc.) connections may be designed to shut down above a temperature of eighty-five degree Celsius. When a shut-down occurs, users may get frustrated from losing the connection on their mobile phones, computers, etc. It is also a health risk where medical equipment such as personal alarms, etc. are transferred from cable connections to wireless connections.

SFP connections may generate up to two Watts or more of heat dissipation. In some applications, SFP ports may be stacked and ganged in high numbers, thereby generating large amounts of combined heat.

Disclosed herein are exemplary embodiments of thermal management assemblies suitable for use (e.g., configured for heat spreading, etc.) with transceivers (e.g., small form-factor pluggable (SFP) transceivers, SFP+ transceivers, quad small form-factor pluggable (QSFP) transceivers QSFP+ transceivers, XFP transceivers, etc.) and other devices (e.g., memory card readers, etc.). In exemplary embodiments, one or more heat spreaders are applied to (e.g., one or more graphite sheets are wrapped around portions of, etc.) a metal spring assembly to improve thermal performance of a device, e.g., QSFP or other transceiver, memory card reader, etc. The metal spring assembly may comprise a metal plate and spring contacts as shown in any one or more of FIGS. 1-5 and FIGS. 7-9 and/or as disclosed in Appendix A, which is incorporated herein by reference in its entirety.

In an exemplary embodiment, a device (e.g., transceiver, a memory card reader, etc.) generally includes a housing (e.g., a cage, etc.). A heat spreading (broadly, thermal management) assembly may be coupled to a side of the housing such that an object (e.g., a connector, a memory card, etc.) inserted into the housing thermally contacts the heat spreading assembly, such that heat spreading assembly may define at least a portion of a thermally-conductive heat path from the inserted object to another component, e.g., the housing, a heat sink, a thermal interface material, a thermoelectric module, a heat spreader, a heat dissipation device, etc. One or more flexible heat spreading wraps or materials (e.g., one or more graphite sheets, etc.) may be wrapped (broadly, disposed) generally around one or more portions (e.g., top and bottom parts, etc.) of the heat spreading assembly.

For example, portions of a graphite sheet may be wrapped (broadly, disposed) around portions of the heat spreading assembly in different directions (e.g., in two non-parallel directions, in perpendicular directions, in X and Y directions, etc.). Continuing with this example, one or more portions of the graphite sheet may be wrapped about one or more end portions of the heat spreading assembly in a first direction parallel to a sliding direction of the object into/out of the housing. One or more other portions of the graphite sheet may be wrapped about one or more side portions of the heat spreading assembly in a second direction that is non-parallel (e.g., perpendicular, etc.) to the first direction.

The heat spreading assembly may include one or more spring finger contacts (broadly, resiliently flexible contacts or elements). The spring finger contacts may provide mechanical or spring pressure, such as between the inserted object, the housing, and the flexible heat spreading wrap, which in turn, may improve thermal contact between the heat spreading assembly (e.g., the wrapped heat spreading material, etc.), the housing, and the inserted object. By way of example, the heat spreading assembly may comprise a first or top part, a second or bottom part, one or more spring finger contacts, and/or other features as disclosed in Appendix A, which is incorporated herein by reference in its entirety.

Also disclosed herein are exemplary embodiments of transceivers that may provide one or more (or none) of the following advantages: increased cooling with increased reliability (e.g., increased reliability even after numerous connects and disconnects of cable connectors to the transceiver, etc.), increased heat transfer, modularity and flexibility, allowance for use of thermoelectric modules (TEMs) and/or thermal interface materials (TIMs), allowance for different materials to meet different height requirements, length requirements, thermal conductivity requirements, passive or active applications, ability to cool a cable connector as well as the housing or cage, etc.

With reference now to the figures, FIG. 1 illustrates an exemplary embodiment of a small form-factor pluggable (SFP) transceiver 100 (broadly, a device) embodying one or more aspects of the present disclosure. As shown, the SFP transceiver 100 includes a small form-factor pluggable cage 102 (broadly, a housing). The cage 102 is adapted to receive a small form-factor pluggable cable connector (broadly, a connector). The SFP transceiver 100 also includes an external heat sink 104. A thermal interface material (TIM) 106 is positioned generally between (e.g., coupled in thermal contact with, etc.) a top side or other side of the cage 102 and the external heat sink 104. The TIM 106 may be used to transfer heat from the cage 102 to the external heat sink 104.

The SFP transceiver 100 also includes spring contacts 108 coupled to the top side of the cage 102 generally between the cable connector and the TIM 106. The spring contacts 108 may be configured to contact a cable connector received in the cage 102 to define, provide, establish, or create at least a portion of a thermally-conductive heat path between the cable connector and the top side of the cage 102 to thereby increase heat transfer from the cable connector to the top side of the cage 102.

The cage 102 may be any suitable cage capable of receiving an SFP cable connector. The cage 102 may have dimensions corresponding to an SFP connector to allow insertion of the SFP cable connector into the cage 102. The cage 102 may receive the cable connector via any suitable releasably coupled engagement, including but not limited to a friction fit, a snap fit, etc. The cage 102 may include an interface for transmitting and/or receiving signals via the SFP connector, such as an optical cable interface, an electrical cable interface, etc. The interface may allow for communication to and/or from the cable connector to a motherboard, printed circuit board (PCB), network card, etc. to which the cage 102 is mounted.

The cage 102 may comprise any suitable material, including metal, etc. For example, the cage 102 may comprise a material suitable for shielding against noise generated by the transfer of data through the cable connector (e.g., electromagnetic interference (EMI) shielding, etc.). Alternative embodiments may include other devices, such as other transceivers (e.g., SFP+ transceivers, XFP transceivers, QSFP transceivers, QSFP+ transceivers, etc.), other devices having housings or cages configured for use with other connectors besides SFP cable connectors, etc. Accordingly, aspects of the present disclosure should not be limited to SFP transceivers and SFP cable connectors.

The heat sink 104 is adapted to transfer heat away from the cage 102 and a cable connector received inside the cage 102, to reduce a temperature of the cage 102 and the cable connector, maintain a temperature of the cage 102 and the cable connector below a specified threshold, etc. The heat sink 104 may include any suitable heat sink material, configurations, etc. suitable to reduce the temperature of the cage 102 and cable connector. For example, the heat sink materials and configuration may be selected such that the heat sink 104 is capable of dissipating heat at a rate sufficient to maintain the temperature of the cage 102 and the cable connector below a specified threshold temperature at which operation of the cable connector would otherwise be impaired. Transfer of heat to the heat sink 104 may reduce the amount of heat that is transferred from the cable connector to a board of the SFP transceiver 100, thereby reducing the amount of heat that could dissipate further from the board to more sensitive components.

The thermal interface material 106 may include any suitable material (e.g., gap filler, etc.) for increasing heat transfer from a top of the cage (e.g., from a spring contact 108 defining a portion of the top of the cage) to the heat sink 104. The thermal interface material 106 may provide increased thermal conductivity over air gaps, as the thermal interface material 106 may fill in gaps between surfaces that would otherwise be separated by air. Accordingly, the thermal interface material 106 may have a higher thermal conductivity than air.

The thermal interface material 106 may be coupled between the top side of the cage 102 and the heat sink 104 to transfer heat from the cage 102 to the heat sink 104. In some embodiments, the thermal interface material 106 may include one or more thermoelectric modules. For example, a thermoelectric module may be coupled between the top side of the cage 102 and the heat sink 104 to transfer heat from the cage 102 (e.g., a connector received in the cage, a spring contact 108 in contact with a connector, etc.) to the heat sink 104. For example, the thermal interface material 106 may be coupled between a thermoelectric module and the cage 102, between the thermoelectric module and the heat sink 104, etc., to increase thermal conductivity from the cage 102 to thermoelectric module and/or the heat sink 104.

A thermoelectric module may be any suitable module capable of transferring heat between opposing sides of the module when a voltage is applied to the module. The thermoelectric module may have a cold side oriented towards the cage 102 and a hot side oriented towards the heat sink 104. The cold side of the thermoelectric module may be in direct contact with the top side of the cage 102, may contact the top side of the cage 102 via a thermal interface material, etc. Similarly, the hot side of the thermoelectric module may be in direct contact with the heat sink 104, may contact the heat sink 104 via thermal interface material 106, etc.

As shown in FIG. 1, spring contacts 108 are coupled to the top side of the cage 102 and may be configured to contact a cable connector (not shown) received in the cage 102. The spring contacts 108 help create a thermally-conductive heat path between the cable connector and the top side of the cage 102 (e.g., a thermally-conductive heat path from the connector to the thermal interface material 106, etc.) to increase heat transfer from the cable connector to the top side of the cage 102. For example, the spring contacts 108 may provide mechanical or spring pressure between the cable connector and the cage 102, the thermal interface material 106, etc., thus improving the thermal contact between the cable connector and the cage 102, the thermal interface material 106, etc.

The spring contacts 108 may comprise any suitable thermally-conductive material capable of transferring heat from the cable connector to the top of the cage 102, including stainless steel, etc. The spring contacts 108 may comprise a sufficiently rigid material to maintain at least some mechanical pressure between the cable connector and the top of the cage 102. In some embodiments, the spring contacts 108 comprise a metallic thermally-conductive material.

The spring contacts 108 may be coupled to the cage 102 using any suitable connections. In some embodiments, the spring contacts 108 may be coupled to the cage 102 via laser welding, via rivets, via glue, etc.

The spring contacts 108 may be dimensioned to apply mechanical pressure between a connector received in the cage 102 and a top side of the cage 102, the thermal interface material 106, etc. For example, the spring contacts 108 may have a height corresponding to a distance between a cable connector and a top of the cage 102 when the cable connector is inserted into the cage 102, may have a height that is slightly larger than a distance between a cable connector and a top of the cage 102 when the cable connector is inserted into the cage 102 such that the cable connector slightly deforms the spring contacts 108 when inserted into the cage 102, etc. Accordingly, the spring contacts 108 may comprise a material that is resiliently compressible, deformable, etc. to apply mechanical pressure to the cable connector.

The spring contacts 108 may be coupled to a metal plate 110 (broadly, electrically-conductive support). The metal plate 110 may increase a surface area in contact with the cable connector when the cable connector is received in the cage 102, thereby increasing the thermal conductivity from the cable connector, through the spring contacts 108 to the top of the cage. In some embodiments, the top side of the cage 102 may include an opening in which the metal plate 110 is positioned such that the metal plate 110 and/or the spring contacts 108 define at least a portion of the top side of the cage 102.

The metal plate 110 may comprise any thermally-conductive material suitable for transferring heat from the cable connector to the spring contacts 108. The metal plate 110 may be adapted to increase the mechanical pressure, surface area of thermal contact, etc. applied to the cable connector when the cable connector is received in the cage 102.

Figure 2:
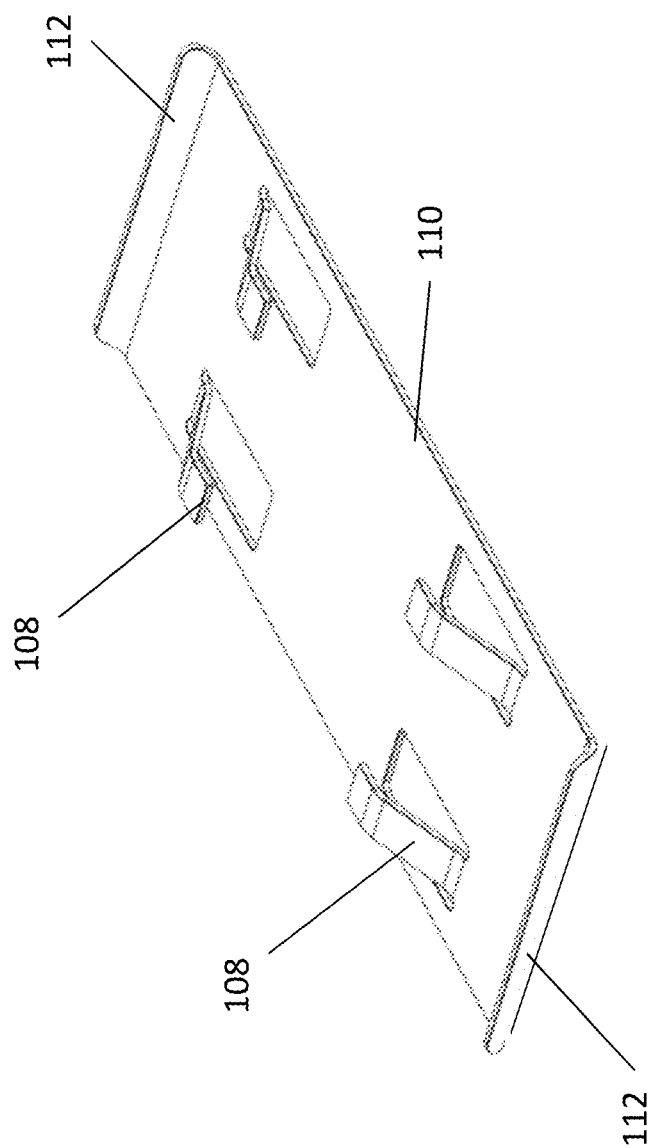
FIG. 2 is a perspective view of the spring contacts and metal plate of the SFP transceiver shown in FIG. 1.

FIG. 2 illustrates an example metal plate 110 with spring contacts 108. As shown in FIG. 2, the metal plate 110 may be integrally formed with the spring contacts 108. For example, a piece of metal may be cut to form the spring contact portions. The spring contacts 108 may then be defined by bending cut spring contact portions upwards from the metal plate 110. In other embodiments, spring contacts 108 may be coupled to the metal plate 110, adhered to the metal plate 110, etc.

The metal plate 110 may include rounded ends 112. The rounded ends 112 may be adapted to allow a cable connector to be inserted against the bottom side of the metal plate 110 without catching on ends of the metal plate 110. For example, the rounded ends 112 may allow the connector to slide past and under edges of the metal plate 110 when the cable connector is inserted into the cage 102. The rounded ends may be formed using any suitable technique, including bending of the metal plate 110, etc.

Although FIG. 2 illustrates four spring contacts 108, it should be apparent that other embodiments may include any suitable number of spring contacts, including but not limited to a single spring contact, two spring contacts, three spring contacts, more than four spring contacts, etc. Similarly, FIG. 2 illustrates the metal plate 110 as having a rectangular shape, but it should be apparent that other embodiments may include any other suitable shapes for the metal plate 110, including circular metal plates, square metal plates, etc.

Figure 3:
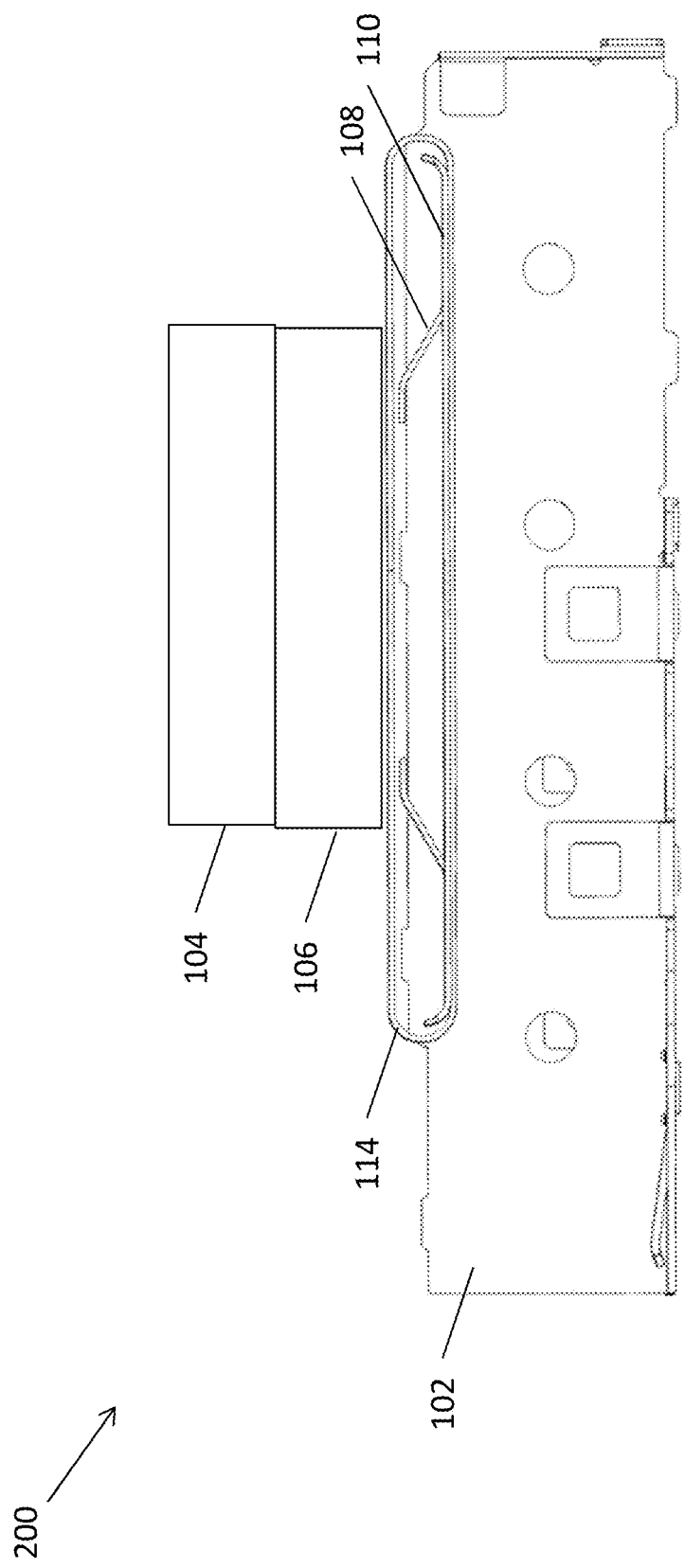
FIG. 3 is a cross-sectional side view of the SFP transceiver shown in FIG. 1, and further illustrating a graphite sheet wrapped around the spring contacts and metal plate according to an exemplary embodiment.

FIG. 3 illustrates an exemplary embodiment of a small form-factor pluggable (SFP) transceiver 200 embodying one or more aspects of the present disclosure. As shown in FIG. 3, a graphite sheet 114 is wrapped around at least a portion of the spring contacts 108. Similar to the SFP transceiver 100 of FIG. 1, the SFP transceiver 200 illustrated in FIG. 2 includes a small form-factor pluggable cage 102. The cage 102 is adapted to receive a small form-factor pluggable cable connector (not shown). The SFP transceiver 200 also includes an external heat sink 104. A thermal interface material (TIM) and/or thermoelectric module (TEM) 106 is coupled between a top side of the cage 102 and the external heat sink 104 to transfer heat from the cage 102 to the external heat sink 104.

The SFP transceiver 200 also includes spring contacts 108 coupled to the top side of the cage 102. The spring contacts 108 are adapted to contact a cable connector received in the cage 102 to create a thermally-conductive heat path between the cable connector and the top side of the cage 102 to increase heat transfer from the cable connector to the top side of the cage 102.

As shown in FIG. 3, the graphite sheet 114 is wrapped around at least a portion of the spring contacts 108 and metal plate 110. The graphite sheet 114 may be adapted to increase thermal conductivity between a cable connector received in the cage 102 and a top side of the cage 102. In some embodiments, the top side of the cage 102 may include an opening with the graphite sheet 114 positioned within the opening to thereby define a portion of the top side of the cage 102. Accordingly, the graphite sheet 114 may contact the thermal interface material 106 to spread and transfer heat from a cable connector to the thermal interface material 106.

Any suitable graphite material (or other heat spreading material) may be used that is capable of being wrapped around at least a portion of the spring contacts 108, the metal plate 110, etc. For example, the graphite sheet 114 may have a very high thermal conductivity and may conduct heat well from the cable connector to the top of the cage 102.

Figure 4:
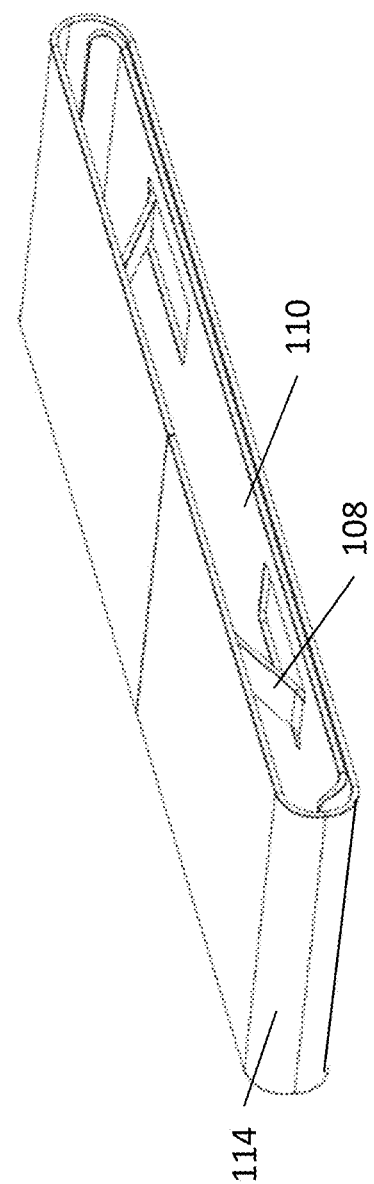
FIG. 4 is a perspective view of the graphite sheet shown in FIG. 3 wrapped around the spring contacts and metal plate.

FIG. 4 illustrates the spring contacts 108, metal plate 110, and graphite sheet 112 of FIG. 3. As shown in FIG. 4, the graphite sheet 114 may be wrapped around at least a portion of the spring contacts 108 and the metal plate 110. The graphite sheet 114 is illustrated as wrapped around the metal plate 110 in a direction parallel to the length of the metal plate 110 and/or parallel to the direction in which the connector 116 (FIG. 5) is slidably inserted into and removed from the cage 102. As should be apparent, other embodiments may include one or more graphite sheets wrapped in other direction(s) about the spring contacts 108 and/or metal plate 110.

In some embodiments, the graphite sheet 114 may comprise synthetic graphite. The graphite sheet 114 may include a polyethylene terephthalate (PET) layer for increased mechanical and/or abrasion resistance and/or an adhesive material (e.g., pressure sensitive adhesive (PSA), etc.) for adhering the graphite sheet 114 to a surface(s), for connecting the graphite sheet 114 to a surface(s), etc. In exemplary embodiments, the graphite sheet 114 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite from Laird Technologies.

In some embodiments, the graphite sheet 114 may comprise a label having indicia indicative of properties of the SFP transceiver 200. Using a graphite label for the SFP transceiver 200 may increase thermal conductivity from the cable connector to a heat sink, etc., while also providing information about properties of the SFP transceiver 200.

Figure 5:
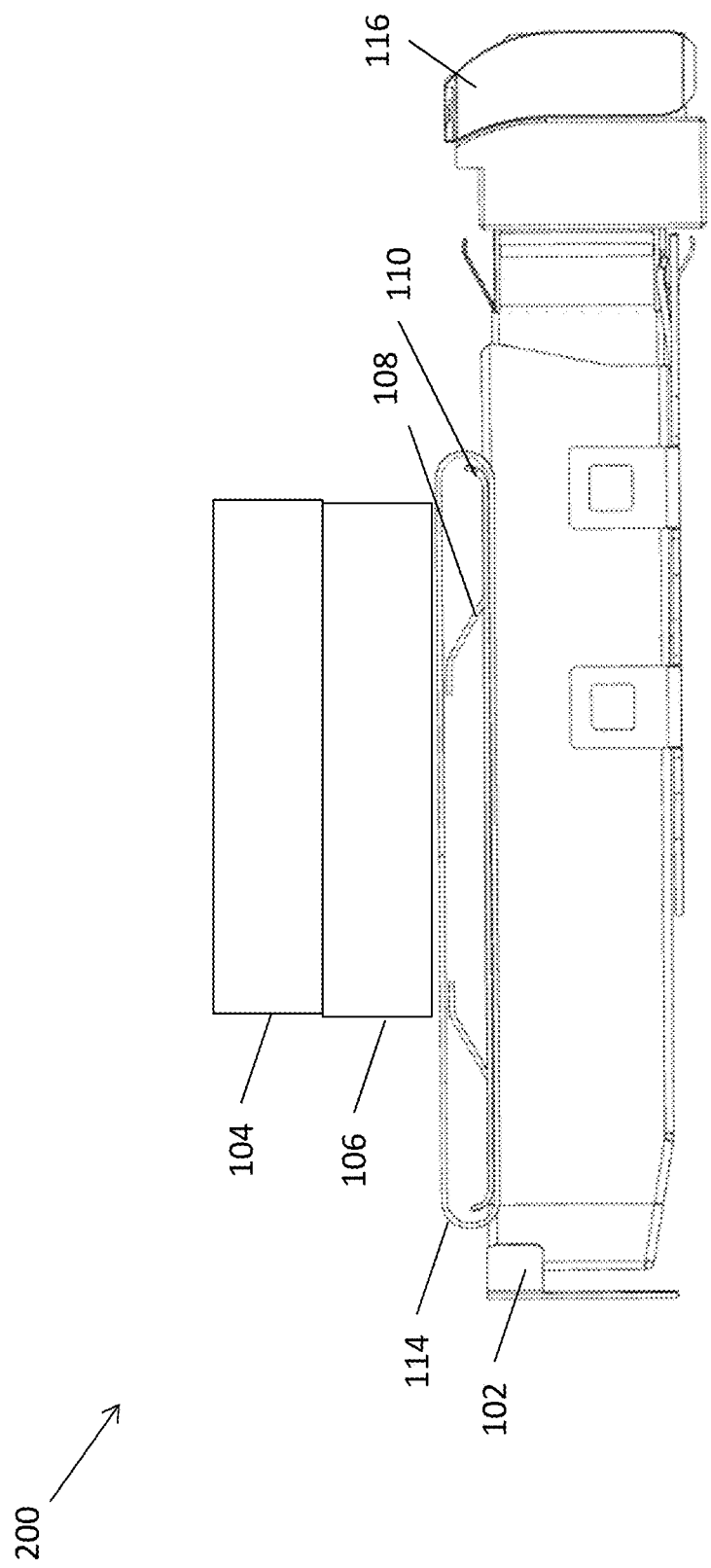
FIG. 5 is a cross-sectional side view of the SFP transceiver shown in FIG. 3, and further illustrating a cable connector received in the SFP transceiver.

FIG. 5 illustrates the SFP transceiver 200 of FIG. 3, with a cable connector 116 received in the cage 102. As shown in FIG. 5, the cable connector 116 contacts the graphite sheet 114 along the bottom surface of the metal plate 110 when the cable connector 116 is received within the cage 102.

As described above, the spring contacts 108, metal plate 110, and graphite sheet 114 increase thermal conductivity from the cable connector to the top of the cage 102, where heat from the cable connector 116 may be dissipated by the heat sink 104 via the thermal interface material 106, which may include one or more thermoelectric modules.

In some embodiments, a thermally-conductive and electrically-conductive material may be wrapped around at least a portion of the TIM 106. Accordingly, the TIM 106 and material wrapped around the TIM 106 may provide a thermally and electrically conductive path between the SFP transceiver cage 102 and a heat sink or other materials, etc. This may increase heat transfer away from a cable connector received in the cage 102 and also electrically ground the cage 102.

Figure 6:
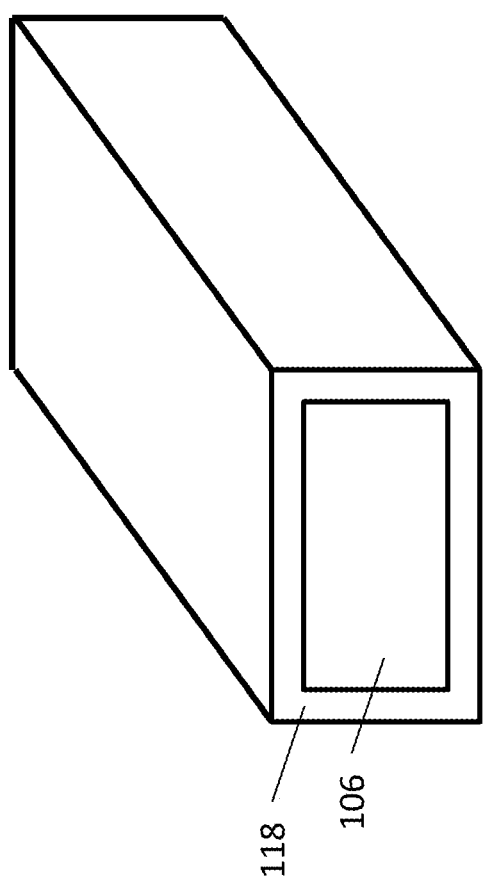
FIG. 6 is a perspective view of an example thermally-conductive and electrically-conductive material wrapped around the thermal interface material shown in FIG. 1.

FIG. 6 illustrates an example TIM 106 and a thermally-conductive and electrically-conductive material 118 wrapped around the TIM 106. Although FIG. 6 illustrates the thermally-conductive/electrically-conductive material 118 wrapped around the top, bottom, and sides of the TIM 106, it should be apparent that other embodiments may include thermally-conductive/electrically-conductive material 118 wrapped around other parts of the TIM 106 (e.g., ends of the TIM 106, etc.).

The TIM 106 may include any material suitable for conducting heat from the cage 102 to an external heat sink, etc. Example thermal interface materials that may be used in exemplary embodiments include thermal gap fillers, thermal phase change materials, thermally-conductive EMI absorbers or hybrid thermal/EMI absorbers, thermal putties, thermal pads, etc. The TIM 106 may be compressible between the cage 102 and a heat sink. For example, in some embodiments, the TIM 106 may comprise a fabric-over-foam material, such that the TIM 106 may provide both a thermal interface material and an electrically and thermally-conductive fabric wrapped around at least a portion of the thermal interface material. The fabric-over-foam may be wrapped with metal (e.g., copper foil, other metal foil, etc.).

In some embodiments, the TIM 106 may include a silicone elastomer. The silicone elastomer may be filled with a suitable thermally-conductive material, including ceramic, boron nitride, etc. The silicone elastomer may be treated to allow the thermally-conductive and electrically-conductive material 118 to adhere to the silicone elastomer. For example, the TIM 106 may include a thermal interface material from Laird Technologies, such as any one or more of the Tputty™ 502 series thermal gap fillers, Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, Tpcm™ 780 series phase change materials, Tpcm™ 900 series phase change materials etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc. In some exemplary embodiments, the TIM 106 may comprise a compliant gap filler having high thermal conductivity. By way of example, the TIM 106 may comprise a thermal interface material of Laird, such as one or more of Tflex™ 200, Tflex™ HR200, Tflex™ 300, Tflex™ 300TG, Tflex™ HR400, Tflex™ 500, Tflex™ 600, Tflex™ HR600, Tflex™ SF600, Tflex™ 700, Tflex™ SF800 thermal gap fillers.

The TIM 106 may comprise an elastomer and/or ceramic particles, metal particles, ferrite EMI/RFI absorbing particles, metal or fiberglass meshes in a base of rubber, gel, or wax, etc. The TIM 106 may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. The TIM 106 may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface materials to closely conform (e.g., in a relatively close fitting and encapsulating manner, etc.) to a mating surface when placed in contact with (e.g., compressed against, etc.) the mating surface, including a non-flat, curved, or uneven mating surface.

The TIM 106 may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the TIM 106 may include ceramic filled silicone elastomer, boron nitride filled silicone elastomer, or a thermal phase change material that includes a generally non-reinforced film.

Exemplary embodiments may include one or more thermal interface materials having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the thermal interface material and loading percentage of the thermally conductive filler, if any. These thermal conductivities are only examples as other embodiments may include a thermal interface material with a thermal conductivity higher than 6 W/mK, less than 1 W/mK, or other values between 1 and 6 W/mK. Accordingly, aspects of the present disclosure should not be limited to use with any particular thermal interface material as exemplary embodiments may include a wide range of thermal interface materials.

The thermally-conductive/electrically-conductive material 118 wrapped around the TIM 106 may include any material suitable for conducting heat from the cage 102 and for electrically grounding the cage 102. In some embodiments, the thermally-conductive/electrically-conductive material 118 may include a foil (e.g., copper foil, etc.), a metallized and/or plated fabric (e.g., nickel-copper plated nylon, etc.), a metalized plastic, a graphite sheet, etc. The thermally-conductive/electrically-conductive material 118 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite from Laird Technologies.

The thermally and electrically conductive material 118 may have any suitable thickness that allows the material 118 to be wrapped around at least a portion of the TIM 106. For example, in some embodiments the thermally and conductive material may have a thickness of less than about one hundred micrometers (um) (e.g., 17 um, 25 um, 40 um, 70 um, 100 um, etc.). The material may have any suitable thermal conductivity (e.g., about 500 to 1900 W/mK, etc.).

Figure 7:
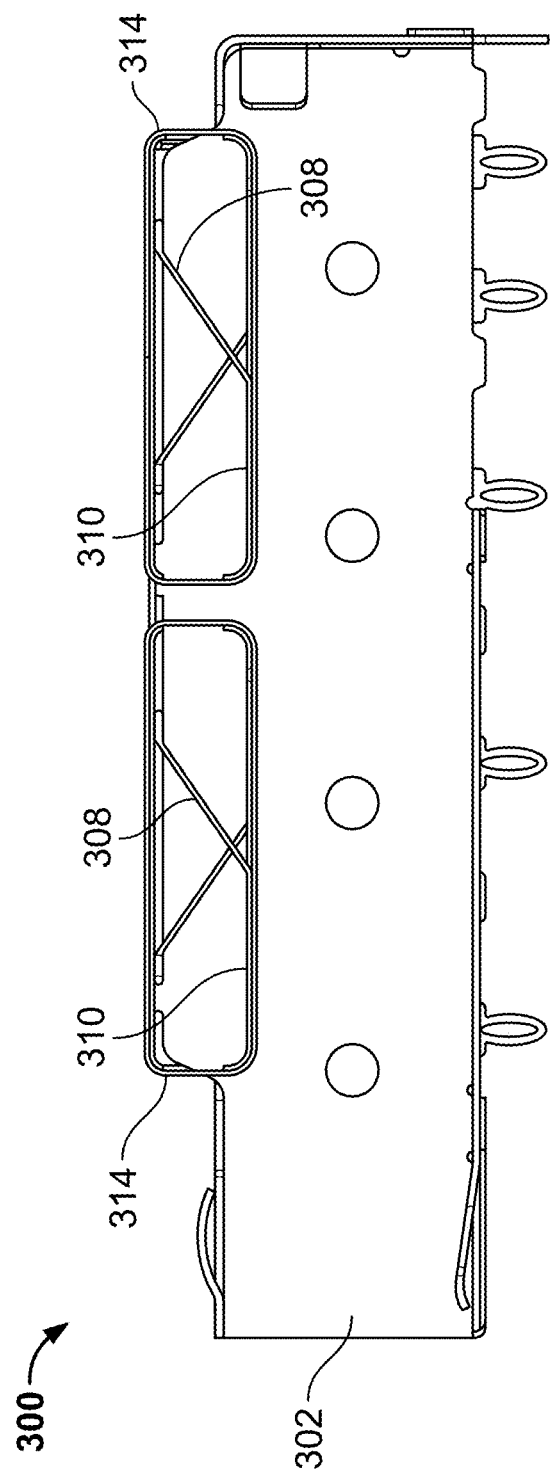
FIG. 7 is a cross-sectional side view of a small form-factor pluggable (SFP) transceiver according to an exemplary embodiment that includes first and second graphite sheets wrapped around respective first and second metal plates and spring contacts.
Figure 8:
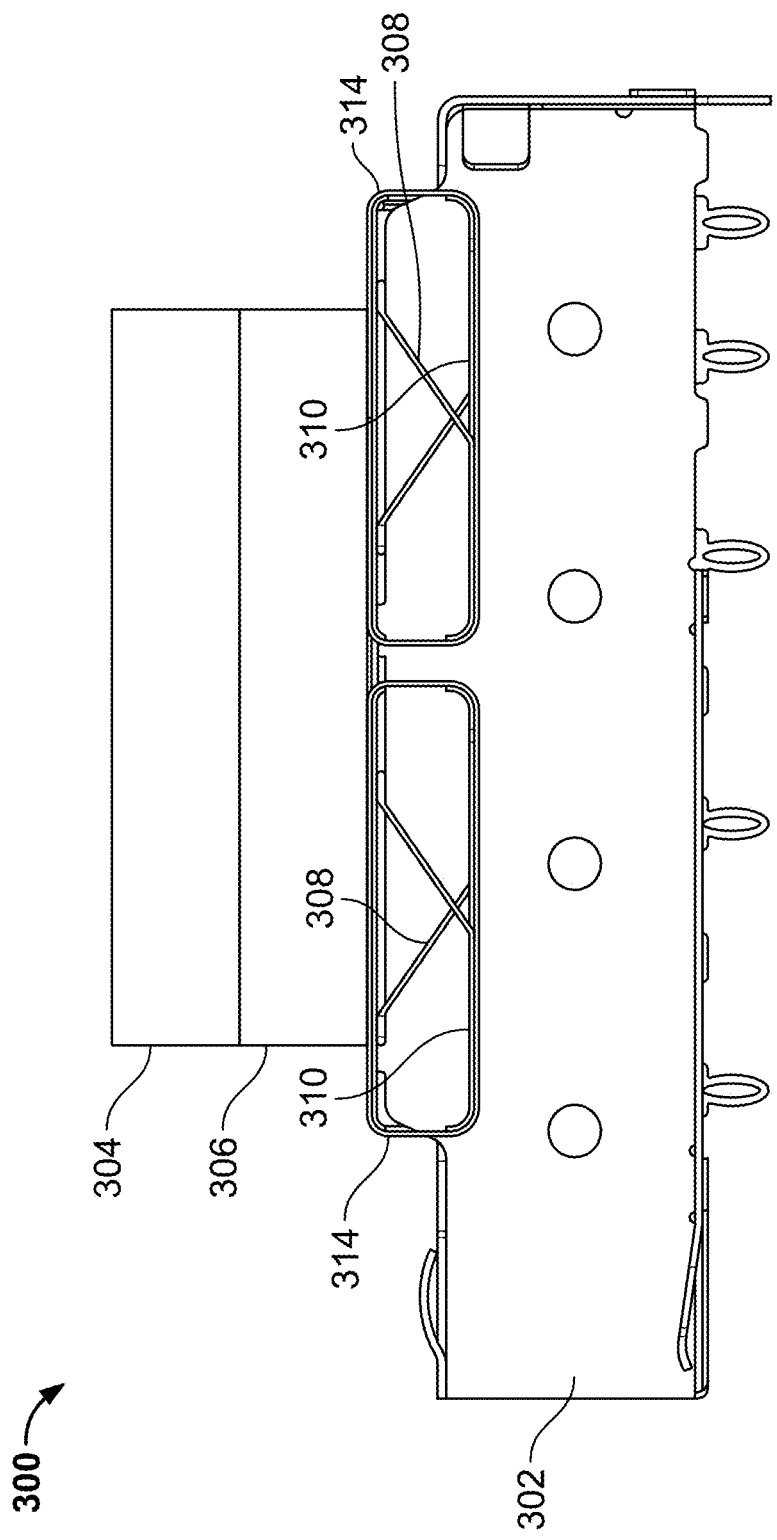
FIG. 8 is a cross-sectional side view of the SFP transceiver shown in FIG. 7, and further illustrating a thermal interface material positioned between the graphite sheets and an external heat sink.
Figure 9:
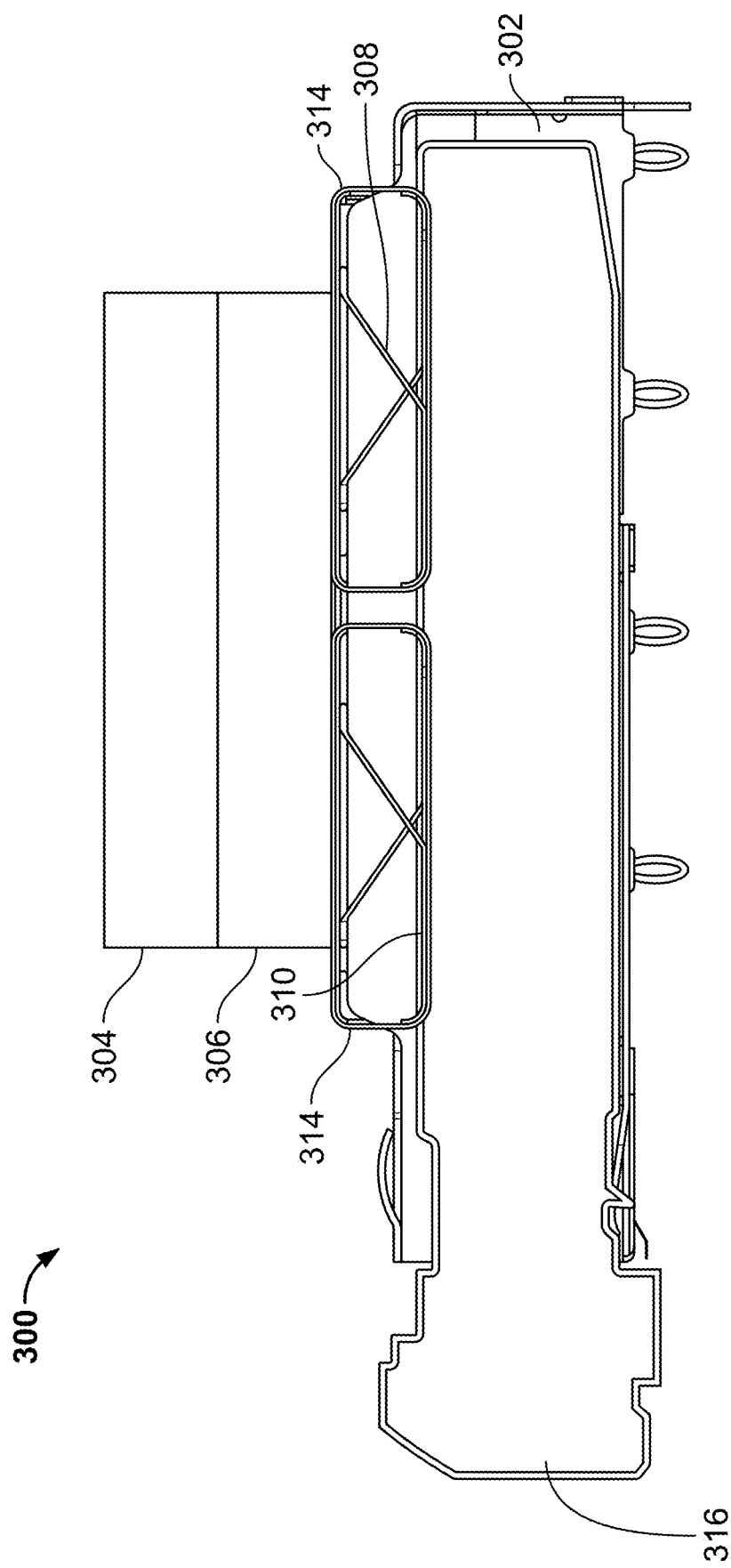
FIG. 9 is a cross-sectional side view of the SFP transceiver shown in FIG. 8, and further illustrating a cable connector received in the cage of the SFP transceiver.

FIGS. 7 through 9 illustrate an exemplary embodiment of a small form-factor pluggable (SFP) transceiver 300 embodying one or more aspects of the present disclosure. The SFP transceiver 300 may be similar to the SFP transceiver 200 of FIG. 3. As shown in FIGS. 7 through 9, multiple graphite sheets 314 are wrapped around portions of the spring contacts 308. The graphite sheets 314 form multiple separate loops that increase the cross section for transferring heat and shorten the thermal transfer path.

The SFP transceiver 300 includes a small form-factor pluggable cage 302 adapted to receive a small form-factor pluggable cable connector 316 (FIG. 9). The cage 302 may be any suitable cage capable of receiving an SFP cable connector 316. The cage 302 may have dimensions corresponding to an SFP connector 316 to allow insertion of the SFP cable connector 316 into the cage 302. The cage 302 may receive the cable connector 316 via any suitable releasably coupled engagement, including but not limited to a friction fit, a snap fit, etc. The cage 302 may include an interface for transmitting and/or receiving signals via the SFP connector 316, such as an optical cable interface, an electrical cable interface, etc. The interface may allow for communication to and/or from the cable connector 316 to a motherboard, printed circuit board (PCB), network card, etc. to which the cage 302 is mounted.

The cage 302 may comprise any suitable material, including metal, etc. For example, the cage 302 may comprise a material suitable for shielding against noise generated by the transfer of data through the cable connector (e.g., electromagnetic interference (EMI) shielding, etc.). Alternative embodiments may include other devices, such as other transceivers (e.g., SFP+ transceivers, XFP transceivers, QSFP transceivers, QSFP+ transceiver, etc.) devices having housings or cages configured for use with other connectors besides SFP cable connectors, etc. Accordingly, aspects of the present disclosure should not be limited to SFP transceivers and SFP cable connectors.

The SFP transceiver 300 also includes spring contacts 308 coupled to the top side of the cage 302, which may be similar or identical to the spring contacts 108 shown in FIGS. 1 through 5. The spring contacts 308 may be configured (e.g., dimensioned, shaped, formed of resilient material, etc.) to provide mechanical or spring pressure for biasing the top and bottom portions of the graphite sheets 314 respectively against and/or in good thermal contact with a thermal interface material 306 (FIGS. 8 and 9) and top of the connector 316, respectively. In turn, this may improve the thermal contact between the top of the connector 316 and the bottom portions of the graphite sheets 314 and between the top portions of the graphite sheets 314 and the thermal interface material 306.

The spring contacts 308 may comprise any suitable thermally-conductive material capable of transferring heat including stainless steel, etc. The spring contacts 308 may comprise a sufficiently rigid material to maintain at least some mechanical pressure between the graphite sheets 314 and the cable connector 316 and thermal interface material 306. In some embodiments, the spring contacts 308 comprise a metallic thermally-conductive material.

The spring contacts 308 may be coupled or attached using any suitable connections. In some embodiments, the spring contacts 308 may be coupled to the cage 302 via laser welding, via rivets, via glue, etc. The spring contacts 308 may be configured (e.g., have a height, etc.) such that the cable connector 316 slightly deforms the spring contacts 308 when inserted into the cage 302, etc. Accordingly, the spring contacts 308 may comprise a material that is resiliently compressible, deformable, etc. to apply mechanical pressure to the cable connector.

In this illustrated embodiment, the spring contacts 308 may include multiple (e.g., first and second, etc.) sets or pluralities of spring contacts 308 that are respectively coupled to corresponding ones of multiple (e.g., first and second, etc.) metal plates 310. By way of example, the SFP transceiver 300 may include first and second metal plates 310 having spring contacts 308 similar or identical to the metal plate 110 and spring contacts 108 shown in FIG. 2. Accordingly, the first and second metal plates 310 shown in FIGS. 7 through 9 may also be integrally formed with the spring contacts 308. For example, a piece of metal may be cut (e.g., stamped, etc.) to form the spring contact portions. The spring contacts 308 may then be defined by bending the cut spring contact portions upwards from the corresponding metal plates 310. In other embodiments, spring contacts 308 may be coupled to the metal plates 310, adhered to the metal plates 310, etc.

The first and second metal plates 310 may include rounded or upwardly curved end portions. The rounded end portions may be adapted to facilitate wrapping of the graphite sheet 314 around the metal plates 310 and/or to allow the cable connector 316 to be inserted along the bottom side of the metal plates 310 without catching on ends of the metal plates 310. For example, the rounded end portions may allow the connector 316 to slide past and under edges of the metal plates 310 and graphite sheets 314 when the cable connector 316 is inserted into the cage 302. The rounded end portions may be formed using any suitable technique, including bending of the metal plates 310, etc.

In some embodiments, the top side of the cage 302 may include one or more openings in which the metal plates 310 are positioned such that the metal plates 310 and/or the spring contacts 308 define at least a portion of the top side of the cage 302.

The metal plates 310 may comprise any thermally-conductive material suitable for transferring heat from the cable connector to the spring contacts 108. The metal plates 310 may be adapted to increase the mechanical pressure, surface area of thermal contact, etc. applied to the cable connector when the cable connector is received in the cage 302.

As shown in FIG. 7, first and second graphite sheets 314 are wrapped around portions of the respective first and second metal plates 310 and spring contacts 308. Accordingly, the first and second graphite sheets 314 form first and second separate loops that help to increase the cross section for transferring heat and shorten the thermal transfer path. The cable connector 316 contacts the graphite sheets 314 along the bottom surfaces of the metal plates 310 when the cable connector 316 is received in the cage 302.

Any suitable graphite material (or other suitable heat spreading material) may be used for the graphite sheets 314 that is capable of being wrapped around at least a portion of the spring contacts 308, the metal plates 310, etc. For example, the graphite sheets 314 may have a very high thermal conductivity and may conduct heat well from the cable connector 316 to the top of the cage 302.

Each graphite sheet 314 may be wrapped around at least a portion of the spring contacts 308 and the corresponding metal plate 310 in a direction parallel to the length of the metal plate 310 (e.g., FIG. 4, etc.) and/or parallel to the direction in which the connector 316 (FIG. 9) is slidably inserted into and removed from the cage 302. As should be apparent, other embodiments may include one or more graphite sheets wrapped in other direction(s) about the spring contacts 308 and/or metal plates 310.

In some embodiments, the graphite sheets 314 may be synthetic. The graphite sheets 314 may include a polyethylene terephthalate (PET) layer for increased mechanical and/or abrasion resistance, and may include an adhesive material for fixing the graphite sheets 314 to a surface, for connecting the graphite sheets 314 to a surface, etc. In an exemplary embodiment, one or more of the graphite sheets 314 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite having carbon in-plane mono-crystal structure.

In some embodiments, a graphite sheet 314 may comprise a label having indicia indicative of properties of the SFP transceiver 300. Using a graphite label for the SFP transceiver 300 may increase thermal conductivity from the cable connector to a heat sink, etc., while also providing information about properties of the SFP transceiver 300.

The SFP transceiver 300 may also include one or more external heat sinks and one or more thermal interface materials (TIMs). As shown in FIGS. 8 and 9, a thermal interface material (TIM) 306 is positioned generally between (e.g., coupled in thermal contact with, etc.) the graphite sheets 314 and an external heat sink 304. The TIM 306 may be used to more efficiently transfer heat from the graphite sheets 314 to the external heat sink 304. Although FIGS. 8 and 9 show a single TIM 306 positioned atop and extending across both graphite sheets 314, other exemplary embodiments may include first and second TIMs respectively positioned atop the first and second graphite sheets 314. Similarly, FIGS. 8 and 9 also show a single heat sink 304 positioned atop the TIM 306, other embodiments may include first and second heat sinks respectively positioned atop first and second TIMs.

The heat sink 304 is adapted to transfer heat away from the cage 302 and a cable connector 316 received inside the cage 302, to reduce a temperature of the cage 302 and the cable connector 316, maintain a temperature of the cage 302 and the cable connector 316 below a specified threshold, etc. The heat sink 304 may include any suitable heat sink material, configurations, etc. suitable to reduce the temperature of the cage 302 and cable connector 316. For example, the heat sink materials and configuration may be selected such that the heat sink 304 is capable of dissipating heat at a rate sufficient to maintain the temperature of the cage 302 and the cable connector 316 below a specified threshold temperature at which operation of the cable connector 316 would otherwise be impaired. Transfer of heat to the heat sink 304 may reduce the amount of heat that is transferred from the cable connector 316 to a board of the SFP transceiver 300, thereby reducing the amount of heat that could dissipate further from the board to more sensitive components.

The thermal interface material 306 may include any suitable material (e.g., gap filler, silicon elastomer, etc.) for increasing heat transfer to the heat sink 304. The thermal interface material 306 may provide increased thermal conductivity over air gaps, as the thermal interface material 306 may fill in gaps between surfaces that would otherwise be separated by air. Accordingly, the thermal interface material 306 may have a higher thermal conductivity than air.

The thermal interface material 306 may be similar or identical to the example TIM 106 shown in FIG. 6 and described above. Accordingly, the thermal interface material 306 may also include a thermally-conductive and electrically-conductive material wrapped around the TIM 306, such as a foil, (e.g., copper foil, etc.), a metallized and/or plated fabric (e.g., nickel-copper plated nylon, etc.), a metalized plastic, a graphite sheet, etc. The thermally-conductive and electrically-conductive material wrapped around the TIM 306 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet. Table 1 below includes additional details about Tgon™ 9000 series synthetic graphite having carbon in-plane mono-crystal structure.

In some embodiments, the thermal interface material 306 may be or may include one or more thermoelectric modules. For example, a thermoelectric module may be coupled between the heat sink 304 and the top portions of the graphite sheets 314 to transfer heat from the graphite sheets 314 to the heat sink 304. As another example, a thermal interface material 306 may be coupled between a thermoelectric module and the cage 302, between a thermoelectric module and the heat sink 304, between a thermal electric module and the graphite sheets 314, etc., between the top of the cage 302 and the graphite sheets 314, etc., to increase thermal conductivity along the heat transfer path from the cage 102 to the heat sink 104.

A thermoelectric module may be any suitable module capable of transferring heat between opposing sides of the module when a voltage is applied to the module. The thermoelectric module may have a cold side oriented towards the cage 302 and a hot side oriented towards the heat sink 304. The cold side of the thermoelectric module may be in direct contact with the top side of the cage 302, may be in thermal contact with the top side of the cage 302 via the thermal interface material 306 and/or graphite sheets 314, etc. Similarly, the hot side of the thermoelectric module may be in direct contact with the heat sink 304, may be in thermal contact with the heat sink 304 via the thermal interface material 306 and/or graphite sheets 314, etc.

Figure 10:
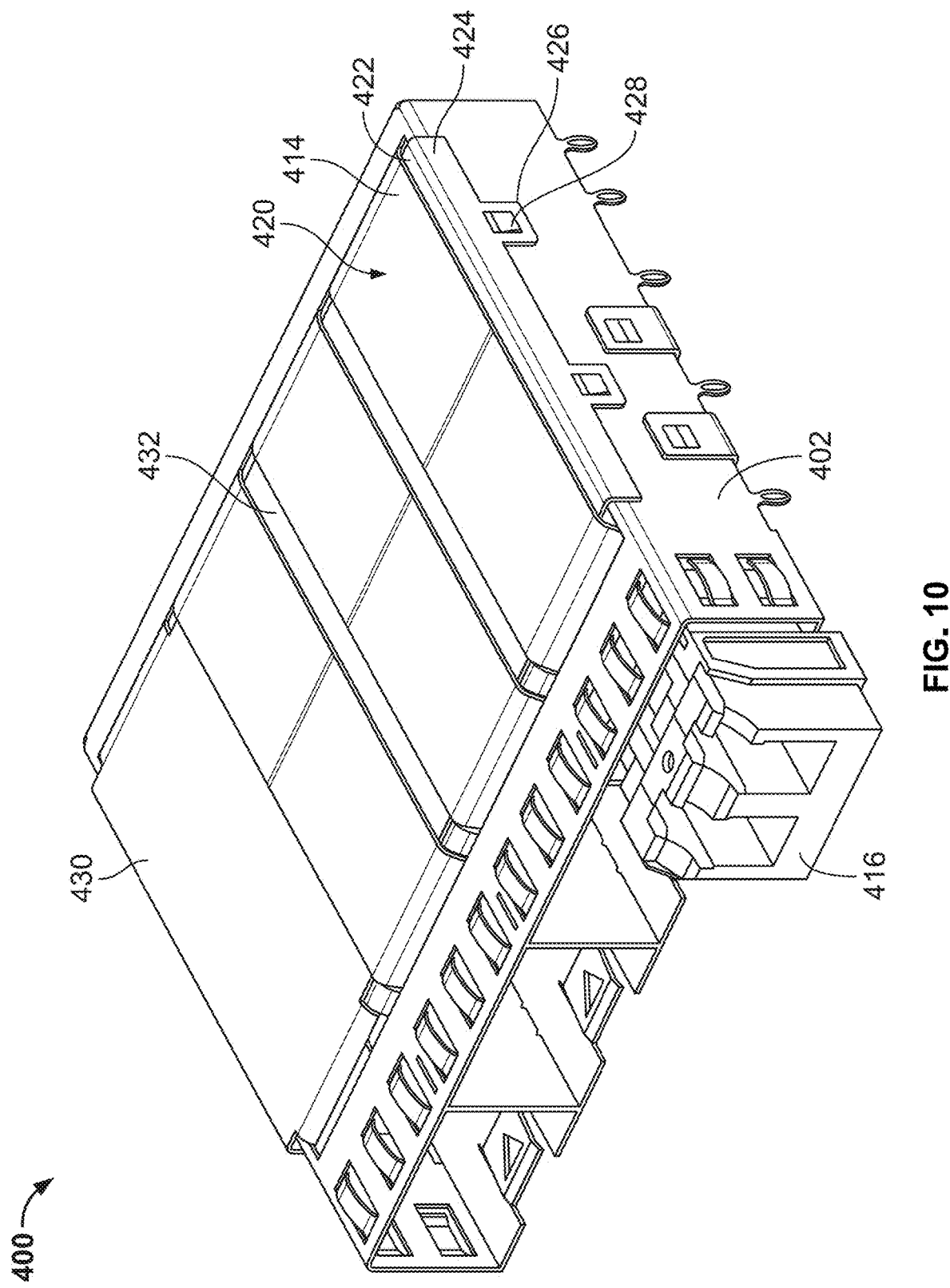
FIG. 10 is a perspective view of a transceiver including a thermal management assembly according to an exemplary embodiment in which a graphite sheet is disposed around an end portion of the thermal management assembly.

FIG. 10 illustrates an exemplary embodiment of a QSFP transceiver 400 (broadly, a device) and a thermal management assembly 420 embodying one or more aspects of the present disclosure. As shown in FIG. 10, the transceiver 400 includes a cage 402 (broadly, a housing) adapted to receive connectors 416. Although FIG. 10 illustrates the thermal management assembly 420 being used with the QSFP transceiver 400, the thermal management assembly 420 may be used with other transceivers (e.g., SFP transceivers, SFP+ transceivers, XFP transceivers, QSFP+ transceivers, etc.), other devices (e.g., memory card readers, etc.) having housings or cages configured for use with other objects (e.g., memory cards, etc.) besides cable connectors, etc. Accordingly, aspects of the present disclosure should not be limited to use with any one particular type of device.

A graphite sheet 414 (broadly, a heat spreader) is wrapped (broadly, disposed) around an end portion 422 of the thermal management assembly 420. The graphite sheet 414 is wrapped around the end portion 422 in a direction generally parallel to the direction in which the connector 416 is slidably inserted into and removed from the cage 502.

The end portion 422 may be defined by one or more parts of the thermal management assembly 420. For example, the thermal management assembly 422 may include a first or top part 424 defining the end portion 422. The thermal management assembly 420 may also include a second or bottom part coupled to and disposed generally under by the top part 424. The bottom part may include one or more features (e.g., rounded or curved edge or lip portions, etc.) to facilitate sliding of the connector 416 under the bottom part when the connetor 416 is slidably plugged into or removed from the cage 402. The top part 424 and/or the bottom part may have features similar or identical to corresponding features of the first and second parts disclosed in Appendix A, which is incorporated herein by reference in its entirety.

The thermal management assembly 420 may include one or more spring contacts configured (e.g., dimensioned, shaped, formed of resilient material, etc.) to provide mechanical or spring pressure for biasing a lower portion of the graphite sheet 414 against and/or in good thermal contact with the top of the connector 416 and for biasing an upper portion of the graphite sheet 414 against and/or in good thermal contact with another surface (e.g., a thermal interface material, etc.). In turn, this may improve the thermal contact between the top of the connector 416 and the lower portion of the graphite sheets 414 and between the upper portion of the graphite sheet 414 and another surface. The spring contacts of the thermal management assembly 420 may be similar or identical to the spring contacts 108 shown in FIGS. 1 through 5, the spring contacts 308 shown in FIGS. 7 through 9 and/or spring contacts disclosed in Appendix A, which is incorporated herein by reference in its entirety.

The top part 424, bottom part, and/or spring contacts may be made of metal (e.g., stainless steel, etc.) or other suitable thermally-conductive materials. The top part 424 may also include latching members 426 (broadly, engagement members) configured to extend downwardly along the sidewalls of the cage 402. The latching members 426 may include latching surfaces and openings to enable latching of the top part 424 to corresponding structure 428 of the cage 402. Alternatively, other methods of mechanically coupling the top part 424 to the cage 402 may be used in other exemplary embodiments.

Although FIG. 10 illustrates the top part 424 as a single piece, other exemplary embodiments may include more than one top part 424 across the top of the cage 402. Similarly, FIG. 10 illustrates a single graphite sheet 414 wrapped around the end portion 424. Alternative embodiments may include one or more additional graphite sheets wrapped around other portions of the thermal management assembly 420. For example, one or more graphite sheets may be wrapped around and opposite end portion 430 and/or a middle portion 432 of the thermal management assembly 420.

Figure 18:
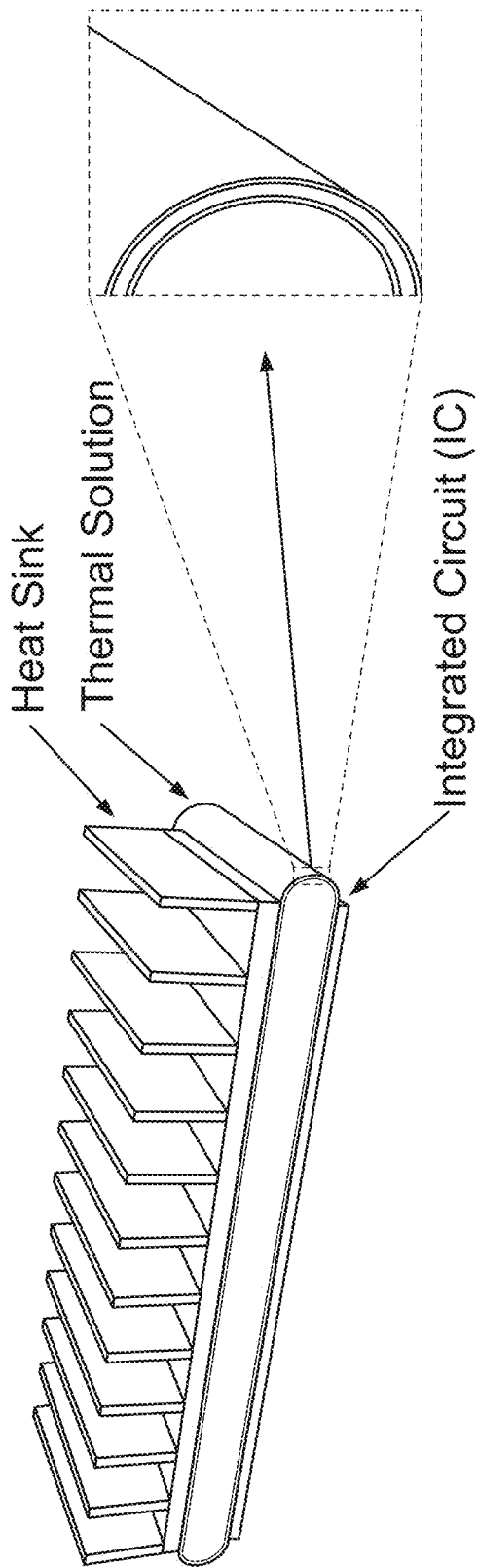
FIG. 18 illustrates a simulation model overview used during an QSFP (quad small form-factor pluggable) simulation investigation to monitor and compare maximum heat source temperatures for thermal management assemblies having different configurations.

The thermal management assembly 420 may be configured to spread and transfer heat from the connector 416 (broadly, a heat source) to one or more other components, e.g., the housing or cage 402, a heat sink, a thermal interface material, a thermoelectric module, a heat spreader, a heat dissipation device, etc. For example, the thermal management assembly 420 may be configured to spread and transfer heat from the connector 416 or another heat source (e.g., an integrated circuit, etc.) directly to an external heat sink (e.g., a heat sink having fins, etc.) as shown in FIG. 18. Or, for example, the thermal management assembly 420 may be configured to spread and transfer heat from the connector 416 (or other heat source) to a heat sink via a thermal interface material. See, for example, the heat sinks 104, 304 and thermal interface materials 106, 306 disclosed herein and shown in FIGS. 1, 3, 5, 6, 8, and 9.

Accordingly, the thermal management assembly 420 may include or be used with one or more external heat sinks and/or one or more thermal interface materials (TIMs) as disclosed herein. Similar to what is shown in FIGS. 3 and 5, a thermal interface material (TIM) may be positioned generally between (e.g., coupled in thermal contact with, etc.) the graphite sheet 414 and an external heat sink. In which case, the TIM may be used to more efficiently transfer heat from the graphite sheet 414 to the external heat sink.

Figure 12:
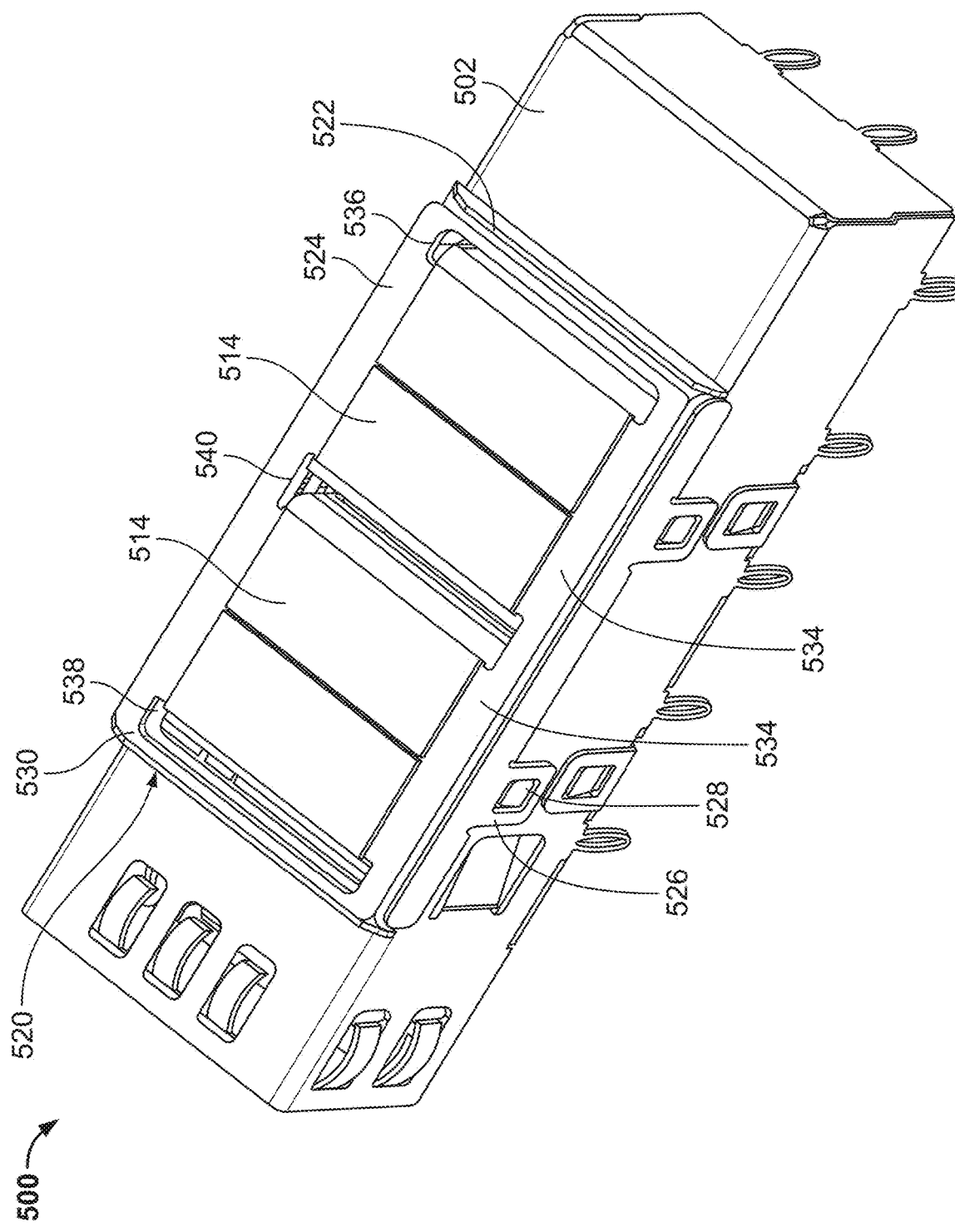
FIG. 12 is a perspective view of a transceiver including a thermal management assembly according to an exemplary embodiment in which first and second graphite sheets are wrapped around portions of the thermal management assembly.

FIG. 12 illustrates an exemplary embodiment of a QSFP transceiver 500 (broadly, a device) and a thermal management assembly 520 embodying one or more aspects of the present disclosure. As shown in FIG. 12, the transceiver 500 includes a cage 502 (broadly, a housing) adapted to receive a connector. Although FIG. 12 illustrates the thermal management assembly 520 being used with the QSFP transceiver 500, the thermal management assembly 520 may be used with other transceivers (e.g., SFP transceivers, SFP+ transceivers, XFP transceivers, QSFP+ transceivers, etc.), other devices (e.g., memory card readers, etc.) having housings or cages configured for use with other objects (e.g., memory cards, etc.) besides cable connectors, etc. Accordingly, aspects of the present disclosure should not be limited to use with any one particular type of device.

First and second graphite sheets 514 (broadly, heat spreaders) are wrapped (broadly, disposed) around portions 534 of the thermal management assembly 520. The first and second graphite sheets 514 are wrapped around the portions 534 in a direction generally parallel to the direction in which a connector would be slidably inserted into and removed from the cage 502. Stated differently, the first and second graphite sheets 514 are wrapped around the portions 534 in a direction generally parallel to a length of the cage 502.

The first and second graphite sheets 514 extend through corresponding first, second, and third openings 536, 538, 540 (e.g., slots, etc.) of the thermal management assembly 520. The first and second openings 536 and 538 are adjacent opposite end portions 522 and 530 of the thermal management assembly 520. The third opening 540 is at about a middle of the thermal management assembly 520 between the openings 536 and 538.

Figure 13:
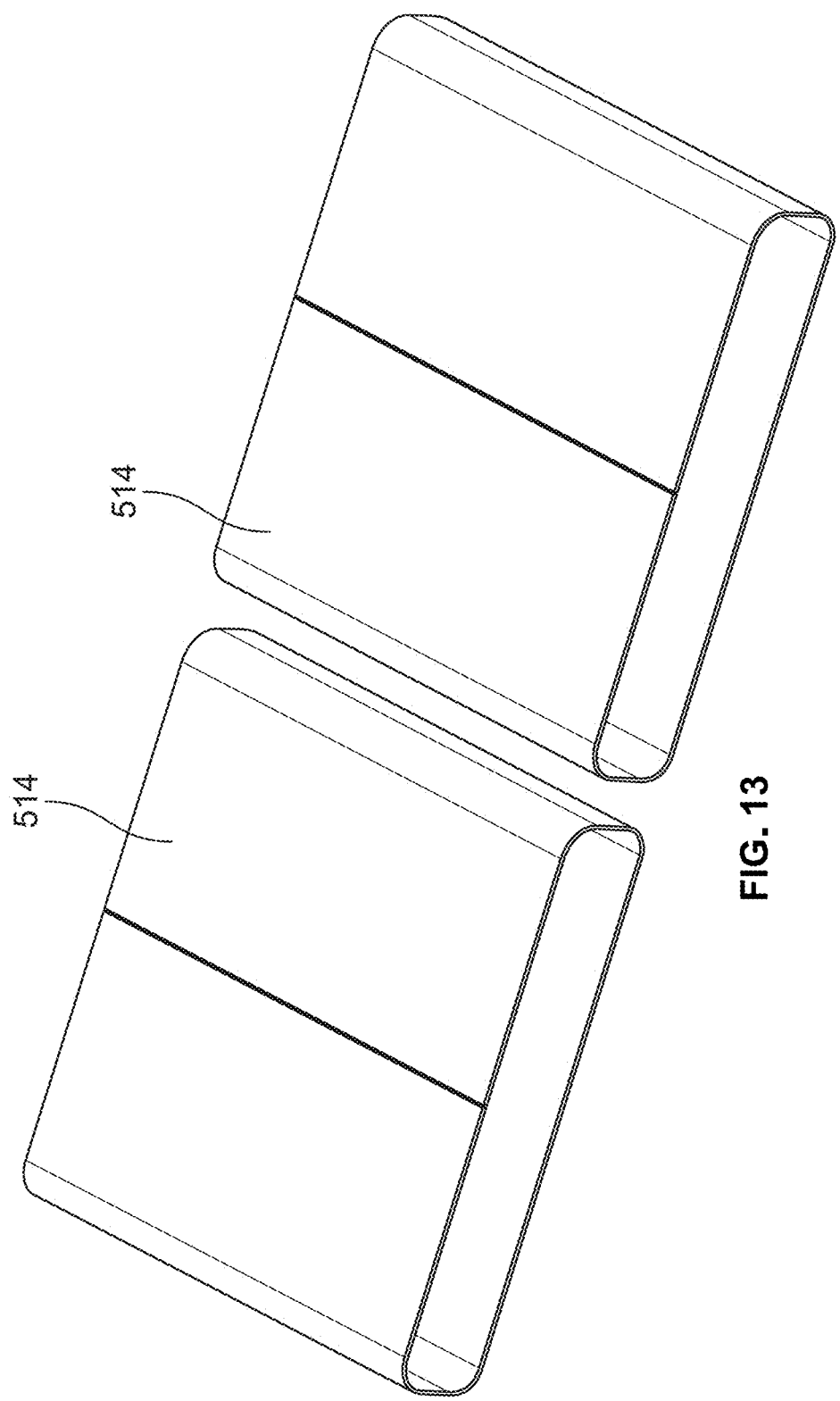
FIG. 13 is a perspective view of the wrapped graphite sheets from FIG. 12 shown without the thermal management assembly or transceiver.

The third opening 540 may be sufficiently wide enough to allow portions of the first and second graphite sheets 514 to each pass through the same third opening 540. As shown in FIGS. 12 and 13, the portions of the first and second graphite sheets 514 that pass through the third opening 540 may be spaced apart from each other with a gap or spaced distance therebetween.

The portions 534 and openings 536, 538, and 540 may be defined by one or more parts of the thermal management assembly 520. For example, the thermal management assembly 520 may include a first or top part 524 defining the portions 534 and openings 536, 538, and 540. The thermal management assembly 520 may also include a second or bottom part coupled to and disposed generally under by the top part 524. The bottom part may include one or more features (e.g., rounded or curved edge or lip portions, etc.) to facilitate sliding of a connector under the bottom part when the connetor is slidably plugged into or removed from the cage 502. The top part 524 and/or the bottom part may have features similar or identical to corresponding features of the first and second parts disclosed in Appendix A, which is incorporated herein by reference in its entirety.

The thermal management assembly 520 may include one or more spring contacts configured (e.g., dimensioned, shaped, formed of resilient material, etc.) to provide mechanical or spring pressure for biasing lower portions of the graphite sheets 514 against and/or in good thermal contact with a top of a connector and for biasing upper portions of the graphite sheets 514 against and/or in good thermal contact with another surface (e.g., a thermal interface material, etc.). In turn, this may improve the thermal contact between the top of the connector and the lower portions of the graphite sheets 514 and between the upper portions of the graphite sheets 514 and another surface. The spring contacts of the thermal management assembly 520 may be similar or identical to the spring contacts 108 shown in FIGS. 1 through 5, the spring contacts 308 shown in FIGS. 7 through 9 and/or spring contacts disclosed in Appendix A, which is incorporated herein by reference in its entirety.

The top part 524, bottom part, and/or spring contacts may be made of metal (e.g., stainless steel, etc.) or other suitable thermally-conductive materials. The top part 524 may also include latching members 526 (broadly, engagement members) configured to extend downwardly along the sidewalls of the cage 502. The latching members 526 may include latching surfaces and openings to enable latching of the top part 524 to corresponding structure 528 of the cage 502. Alternatively, other methods of mechanically coupling the top part 524 to the cage 502 may be used in other exemplary embodiments.

The thermal management assembly 520 may be configured to spread and transfer heat from a connector within the cage 502 to one or more other components, e.g., the housing or cage 502, a heat sink, a thermal interface material, a thermoelectric module, a heat spreader, a heat dissipation device, etc. For example, the thermal management assembly 520 may be configured to spread and transfer heat from a connector or other heat source (e.g., an integrated circuit, etc.) directly to an external heat sink as shown in FIG. 18. Or, for example, the thermal management assembly 520 may be configured to spread and transfer heat from a connector within the cage 502 to a heat sink via a thermal interface material. See, for example, the heat sinks 104, 304 and thermal interface materials 106, 306 disclosed herein and shown in FIGS. 1, 3, 5, 6, 8, and 9.

Accordingly, the thermal management assembly 520 may include or be used with one or more external heat sinks and/or one or more thermal interface materials (TIMs) as disclosed herein. Similar to what is shown in FIGS. 8 and 9, a thermal interface material (TIM) may be positioned generally between (e.g., coupled in thermal contact with, etc.) the graphite sheets 514 and an external heat sink. In which case, the TIM may be used to more efficiently transfer heat from the graphite sheets 514 to the external heat sink.

Figure 14:
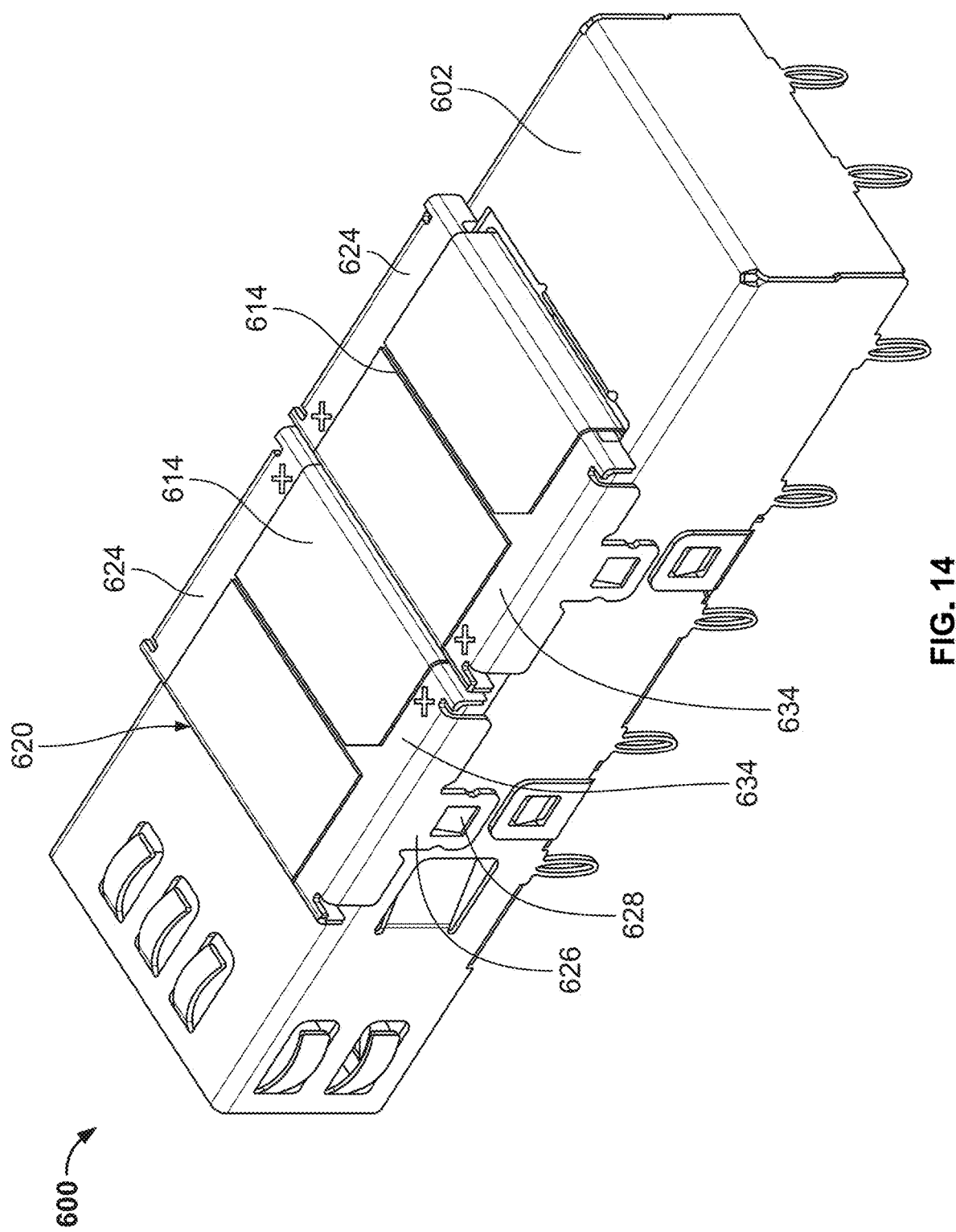
FIG. 14 is a perspective view of a transceiver including a thermal management assembly according to an exemplary embodiment in which first and second graphite sheets are wrapped around portions of the thermal management assembly.
Figure 15:
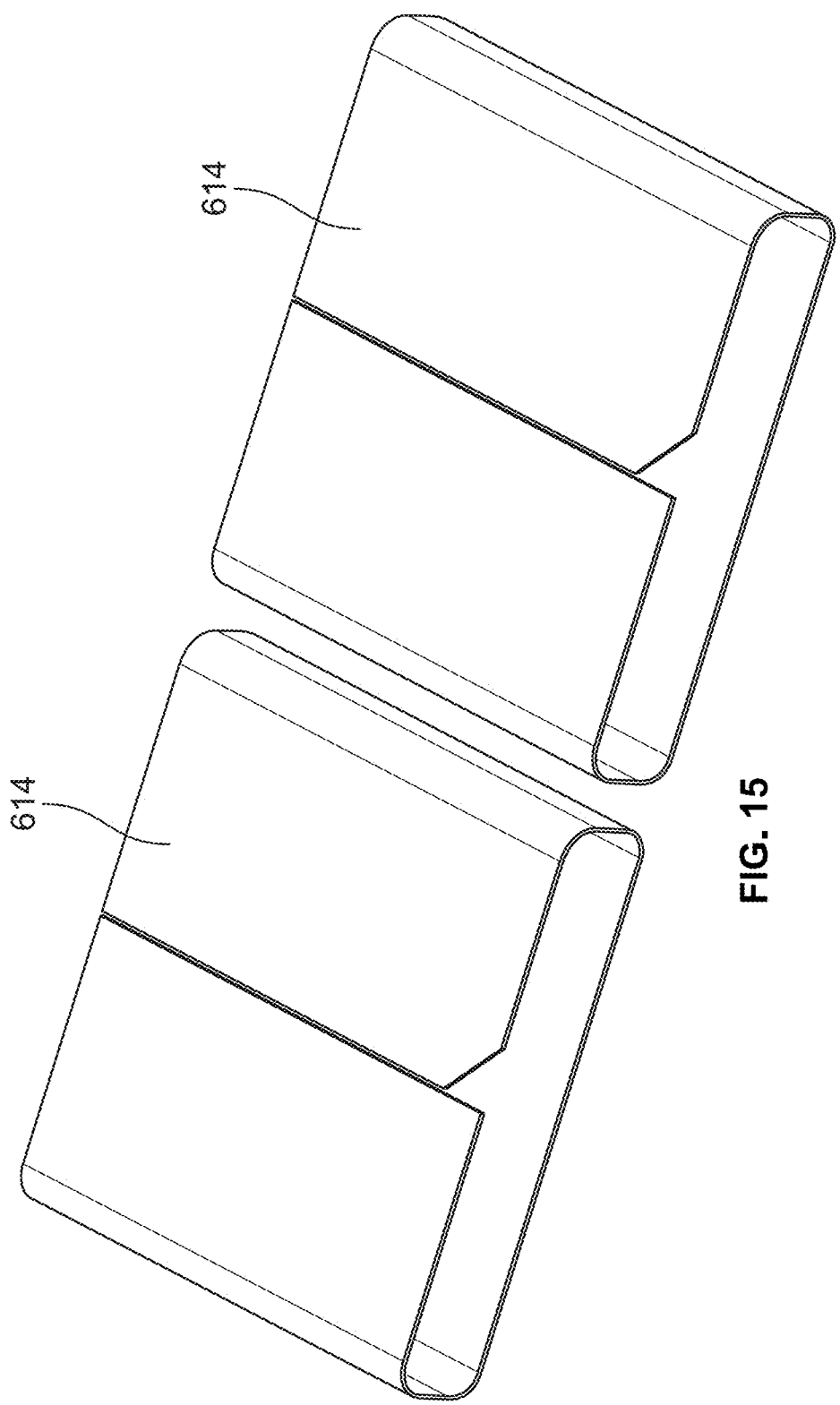
FIG. 15 is a perspective view of the wrapped graphite sheets from FIG. 14 shown without the thermal management assembly or transceiver.

FIG. 14 illustrates an exemplary embodiment of a QSFP transceiver 600 (broadly, a device) and a thermal management assembly 620 embodying one or more aspects of the present disclosure. As shown in FIG. 14, the transceiver 600 includes a cage 602 (broadly, a housing) adapted to receive a connector. Although FIG. 14 illustrates the thermal management assembly 620 being used with the QSFP transceiver 600, the thermal management assembly 620 may be used with other transceivers (e.g., SFP transceivers, SFP+ transceivers, XFP transceivers, QSFP+ transceivers, etc.), other devices (e.g., memory card readers, etc.) having housings or cages configured for use with other objects (e.g., memory cards, etc.) besides cable connectors, etc. Accordingly, aspects of the present disclosure should not be limited to use with any one particular type of device.

First and second graphite sheets 614 (broadly, heat spreaders) are wrapped (broadly, disposed) around respective first and second portions 634 of the thermal management assembly 620. The first and second graphite sheets 614 are wrapped around the first and second portions 634 in a direction generally parallel to the direction in which a connector would be slidably inserted into and removed from the cage 602. Stated differently, the first and second graphite sheets 614 are wrapped around the first and second portions 634 in a direction generally parallel to a length of the cage 602.

In this exemplary embodiment, the first and second portions 634 are defined by first or second top parts 624 of the thermal management assembly 620. The first and second top parts 624 and the first and second graphite sheets 614 may be configured (e.g., sized, shaped, located, etc.) such that adjacent end portions of the first and second graphite sheets 614 thermally contact each other, e.g., without any appreciable gap, without significant spaced distance, and/or with substantially zero gap therebetween.

The thermal management assembly 620 may also include one or more bottom parts coupled to and disposed generally under by the top parts 624. The bottom part(s) may include one or more features (e.g., rounded or curved edge or lip portions, etc.) to facilitate sliding of a connector under the bottom part(s) when the connetor is slidably plugged into or removed from the cage 602. The first and second top parts 624 and/or the bottom part(s) may have features similar or identical to corresponding features disclosed in Appendix A, which is incorporated herein by reference in its entirety.

The thermal management assembly 620 may include one or more spring contacts configured (e.g., dimensioned, shaped, formed of resilient material, etc.) to provide mechanical or spring pressure for biasing lower portions of the graphite sheets 614 against and/or in good thermal contact with a top of a connector and for biasing upper portions of the graphite sheets 614 against and/or in good thermal contact with another surface (e.g., a thermal interface material, etc.). In turn, this may improve the thermal contact between the top of the connector and the lower portions of the graphite sheets 614 and between the upper portions of the graphite sheets 614 and another surface. The spring contacts of the thermal management assembly 620 may be similar or identical to the spring contacts 108 shown in FIGS. 1 through 6, the spring contacts 308 shown in FIGS. 7 through 9 and/or spring contacts disclosed in Appendix A, which is incorporated herein by reference in its entirety.

The first and second top parts 624, bottom part, and/or spring contacts may be made of metal (e.g., stainless steel, etc.) or other suitable thermally-conductive materials. The first and second top parts 624 may also include latching members 626 (broadly, engagement members) configured to extend downwardly along the sidewalls of the cage 602. The latching members 626 may include latching surfaces and openings to enable latching of the top parts 624 to corresponding structure 628 of the cage 602. Alternatively, other methods of mechanically coupling the top parts 624 to the cage 602 may be used in other exemplary embodiments.

The thermal management assembly 620 may be configured to spread and transfer heat from a connector within the cage 602 to one or more other components, e.g., the housing or cage 602, a heat sink, a thermal interface material, a thermoelectric module, a heat spreader, a heat dissipation device, etc. For example, the thermal management assembly 620 may be configured to spread and transfer heat from a connector or other heat source (e.g., an integrated circuit, etc.) directly to an external heat sink as shown in FIG. 18. Or, for example, the thermal management assembly 620 may be configured to spread and transfer heat from a connector within the cage 602 to a heat sink via a thermal interface material. See, for example, the heat sinks 104, 304 and thermal interface materials 106, 306 disclosed herein and shown in FIGS. 1, 3, 5, 6, 8, and 9.

Accordingly, the thermal management assembly 620 may include or be used with one or more external heat sinks and/or one or more thermal interface materials (TIMs) as disclosed herein. Similar to what is shown in FIGS. 8 and 9, a thermal interface material (TIM) may be positioned generally between (e.g., coupled in thermal contact with, etc.) the graphite sheets 614 and an external heat sink. In which case, the TIM may be used to more efficiently transfer heat from the graphite sheets 614 to the external heat sink.

Figure 16:
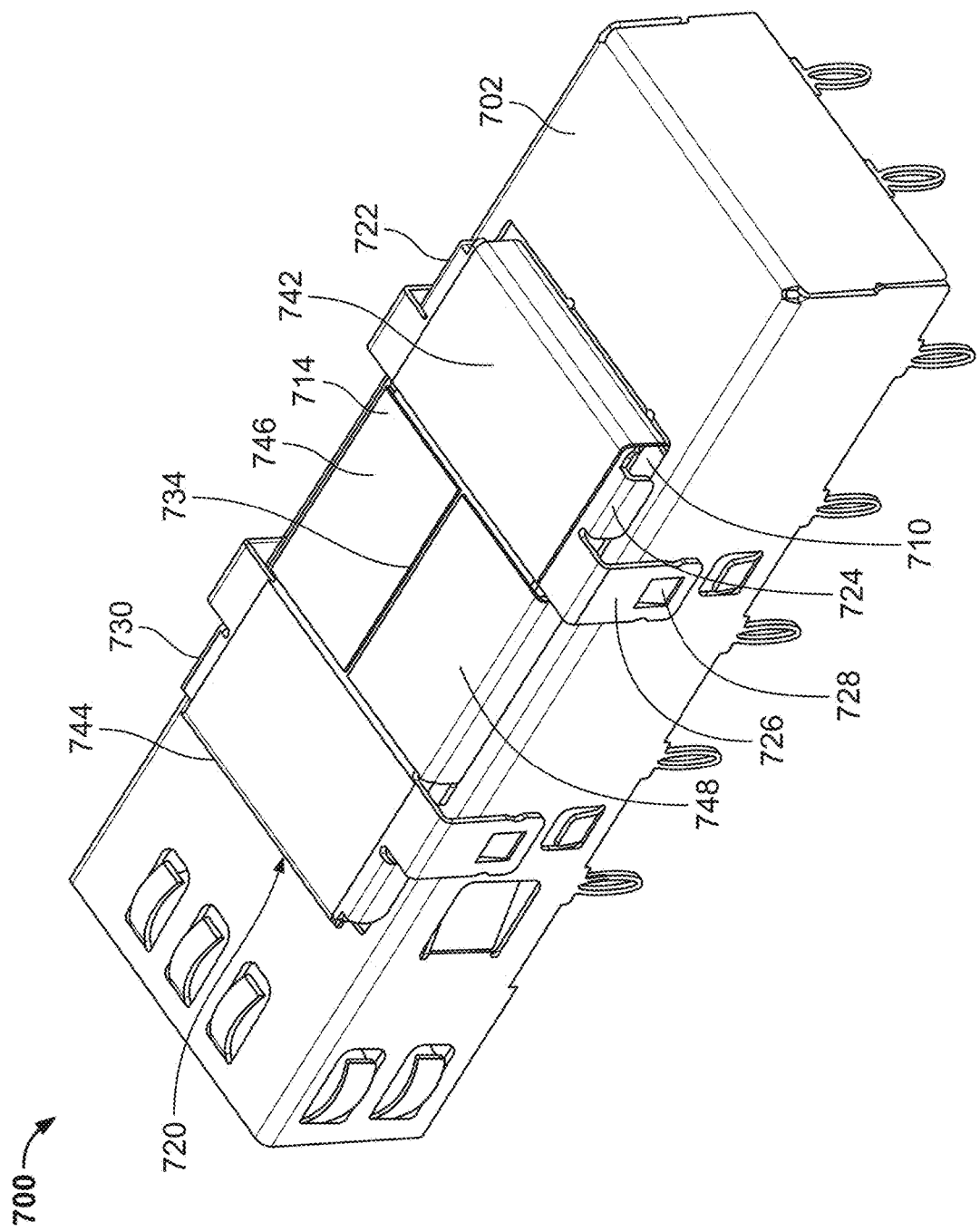
FIG. 16 is a perspective view of a transceiver including a thermal management assembly according to an exemplary embodiment in which portions of the same/single graphite sheet are wrapped around portions of the thermal management assembly in different non-parallel directions.

FIG. 16 illustrates an exemplary embodiment of a QSFP transceiver 700 (broadly, a device) and a thermal management assembly 720 embodying one or more aspects of the present disclosure. As shown in FIG. 16, the transceiver 700 includes a cage 702 (broadly, a housing) adapted to receive a connector. Although FIG. 16 illustrates the thermal management assembly 720 being used with the QSFP transceiver 700, the thermal management assembly 720 may be used with other transceivers (e.g., SFP transceivers, SFP+ transceivers, XFP transceivers, QSFP+ transceivers, etc.), other devices (e.g., memory card readers, etc.) having housings or cages configured for use with other objects (e.g., memory cards, etc.) besides cable connectors, etc. Accordingly, aspects of the present disclosure should not be limited to use with any one particular type of device.

A graphite sheet 714 (broadly, a heat spreader) is wrapped (broadly, disposed) around portions of the thermal management assembly 720 in different non-parallel directions. More specifically, this exemplary embodiment includes first and second (or end) portions 742, 744 of the same/single graphite sheet 714 respectively wrapped generally around opposite end portions 722, 730 of the thermal management assembly 720 in a direction generally parallel to the direction in which a connector would be slidably inserted into and removed from the cage 702. Stated differently, the first and second portions 742 and 744 of the same/single graphite sheet 714 are respectively wrapped generally around the opposite end portions 722, 730 of the thermal management assembly 720 in a direction generally parallel to a length of the cage 702.

Also in this exemplary embodiment, third and fourth (or middle) portions 746 and 748 of the same/single graphite sheet 714 are wrapped generally around a middle portion 734 of the thermal management assembly 720 in a direction non-parallel with the direction in which the first and second portions 742 and 744 were wrapped. The third and fourth portions 746 and 748 of the same/single graphite sheet 714 are wrapped generally around the middle portion 734 of the thermal management assembly 720 in a direction generally perpendicular to the direction in which a connector would be slidably inserted into and removed from the cage 702. Stated differently, the third and fourth portions 746 and 748 of the same/single graphite sheet 714 are wrapped generally around the middle portion 734 of the thermal management assembly 720 in a direction generally perpendicular to a length of the cage 702.

The opposite end portions 722, 730 and middle portion 734 may be defined by one or more parts of the thermal management assembly 720. For example, the thermal management assembly 720 may include a first or top part 724 defining the portions 722, 730, 734. The thermal management assembly 720 may also include a second or bottom part coupled to and disposed generally under by the top part 724. The bottom part may include one or more features (e.g., rounded or curved edge or lip portions, etc.) to facilitate sliding of a connector under the bottom part when the connetor is slidably plugged into or removed from the cage 702. The top part 724 and/or the bottom part may have features similar or identical to corresponding features of the first and second parts disclosed in Appendix A, which is incorporated herein by reference in its entirety.

The thermal management assembly 720 may include one or more spring contacts configured (e.g., dimensioned, shaped, formed of resilient material, etc.) to provide mechanical or spring pressure for biasing a lower portion of the graphite sheet 714 against and/or in good thermal contact with the top of a connector and for biasing an upper portion of the graphite sheet 714 against and/or in good thermal contact with another surface (e.g., a thermal interface material, etc.). In turn, this may improve the thermal contact between the top of the connector and the lower portion of the graphite sheet 714 and between the upper portion of the graphite sheet 714 and another surface. The spring contacts of the thermal management assembly 720 may be similar or identical to the spring contacts 108 shown in FIGS. 1 through 7, the spring contacts 308 shown in FIGS. 7 through 9 and/or spring contacts disclosed in Appendix A, which is incorporated herein by reference in its entirety.

The top part 724, bottom part 710, and/or spring contacts may be made of metal (e.g., stainless steel, etc.) or other suitable thermally-conductive materials. The top part 724 may also include latching members 726 (broadly, engagement members) configured to extend downwardly along the sidewalls of the cage 702. The latching members 726 may include latching surfaces and openings to enable latching of the top part 724 to corresponding structure 728 of the cage 702. Alternatively, other methods of mechanically coupling the top part 724 to the cage 702 may be used in other exemplary embodiments.

The thermal management assembly 720 may be configured to spread and transfer heat from a connector within the cage 702 to one or more other components, e.g., the housing or cage 702, a heat sink, a thermal interface material, a thermoelectric module, a heat spreader, a heat dissipation device, etc. For example, the thermal management assembly 720 may be configured to spread and transfer heat from a connector or other heat source (e.g., an integrated circuit, etc.) directly to an external heat sink as shown in FIG. 18. Or, for example, the thermal management assembly 720 may be configured to spread and transfer heat from a connector within the cage 702 to a heat sink via a thermal interface material. See, for example, the heat sinks 104, 304 and thermal interface materials 106, 306 disclosed herein and shown in FIGS. 1, 3, 5, 6, 8, and 9.

Accordingly, the thermal management assembly 720 may include or be used with one or more external heat sinks and/or one or more thermal interface materials (TIMs) as disclosed herein. Similar to what is shown in FIGS. 3 and 5, a thermal interface material (TIM) may be positioned generally between (e.g., coupled in thermal contact with, etc.) the graphite sheet 714 and an external heat sink. In which case, the TIM may be used to more efficiently transfer heat from the graphite sheet 714 to the external heat sink.

Exemplary embodiments that include wrapping portions of a same/single graphite sheet (or other heat spreader) in different non-parallel directions may provide the benefit of eliminating the challenging task of positioning portions of graphite sheets into relatively narrow gaps, slots, or small spaces (e.g., slots 536, 538, 540 shown in FIG. 12, etc.) during the wrapping process in mass production. Another potential benefit is that a single graphite wrapping may allow for an easier manufacturing process as compared to having two graphite sheets wrapped respectively around two parts (e.g., parts 624 in FIG. 14, etc.), which may then need two product lines. And if the two parts are not interchangeable, the positioning of the two parts may not be interchangeable either. In which case, more attention may be needed during the assembly process to ensure proper positioning of the two parts, which, in turn, may provide the potential for assembly errors in mass productions. With a single graphite wrapping, it may be possible to have more simplified production lines and/or easier graphite wrapping in automated mass production. Additionally, the one-body structure of a single graphite wrapping may have more structural stability against rotational shaking in actual operation as compared to multiple graphite wrappings, which may have the potential to rotate along their length direction.

FIG. 18 illustrates a simulation model overview used during an QSFP (quad small form-factor pluggable) simulation investigation to monitor and compare maximum heat source temperatures when using different thermal management assemblies, specifically, thermal management assembly 420 shown in FIG. 10, thermal management assembly 620 shown in FIG. 12, and thermal management assembly 720 shown in FIG. 16.

For the simulations, each thermal management assembly 420, 620, and 720 included graphite sheets or layers 414, 614, 714, respectively, with a thin layer of polyethylene terephthalate (PET) and pressure sensitive adhesive (PSA) (e.g., 0.05 mm thick layer of PSA/PET, etc.) along each side of the graphite. The PET may provide increased mechanical and/or abrasion resistance for the graphite. The PSA may be used to adhere the graphite to other surfaces. Also for the simulations, the graphite sheets 414, 614, 714 comprised Tgon™ 9000 series synthetic graphite having carbon in-plane mono-crystal structure. Table 1 below includes additional details about Tgon™ 9000 series synthetic graphite from Laird Technologies.

During the simulations, power generation of the integrated circuit was 6 Watts (W). The cooling methods included a fan blowing through the heat sink at a flow rate of 40 cubic feet per minute (CFM), while the rest of the system was under natural convection and radiation with ambient temperature (Tamb) of 22 degrees Celsius (° C.).

Figure 11:
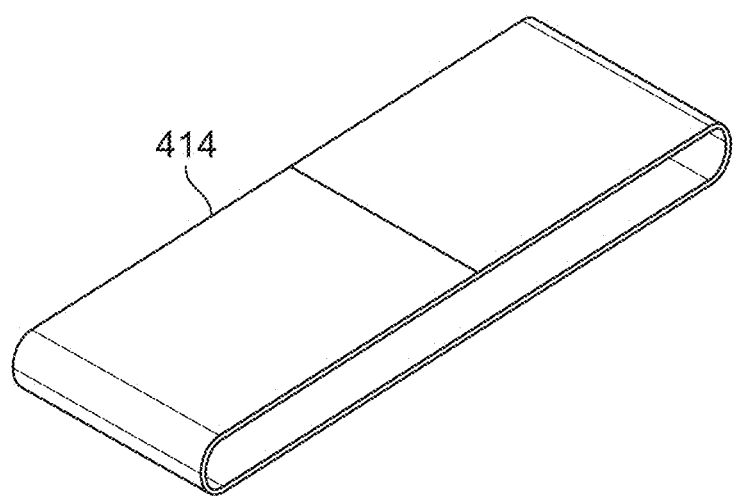
FIG. 11 is a perspective view of the wrapped graphite sheet from FIG. 10 shown without the thermal management assembly or transceiver.

FIG. 19 illustrates the thermal simulation results using the model shown in FIG. 18 along with the wrapped graphite sheet 414 according to the illustrated embodiment shown in FIGS. 10 and 11. As shown in FIG. 19, the maximum temperature of the integrated circuit (broadly, heat source) was 73.1 degrees Celsius (° C.).

Figure 20:
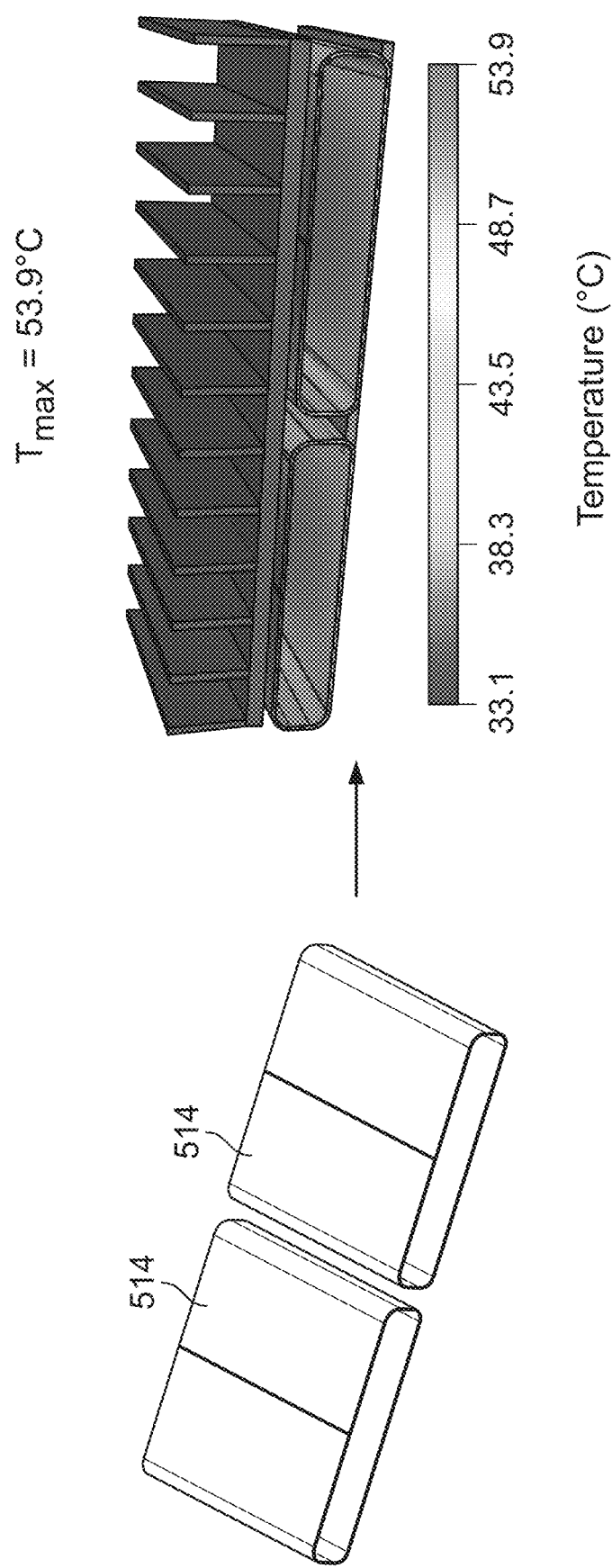
FIG. 20 illustrates the thermal simulation results using the model shown in FIG. 18 along with the first and second wrapped graphite sheets according to the illustrated embodiment shown in FIGS. 12 and 13.

FIG. 20 illustrates the thermal simulation results using the model shown in FIG. 18 along with the first and second wrapped graphite sheets 614 according to the illustrated embodiment shown in FIGS. 12 and 13. As shown in FIG. 20, the maximum temperature of the integrated circuit (broadly, heat source) was 63.9 degrees Celsius (° C.).

Figure 17:
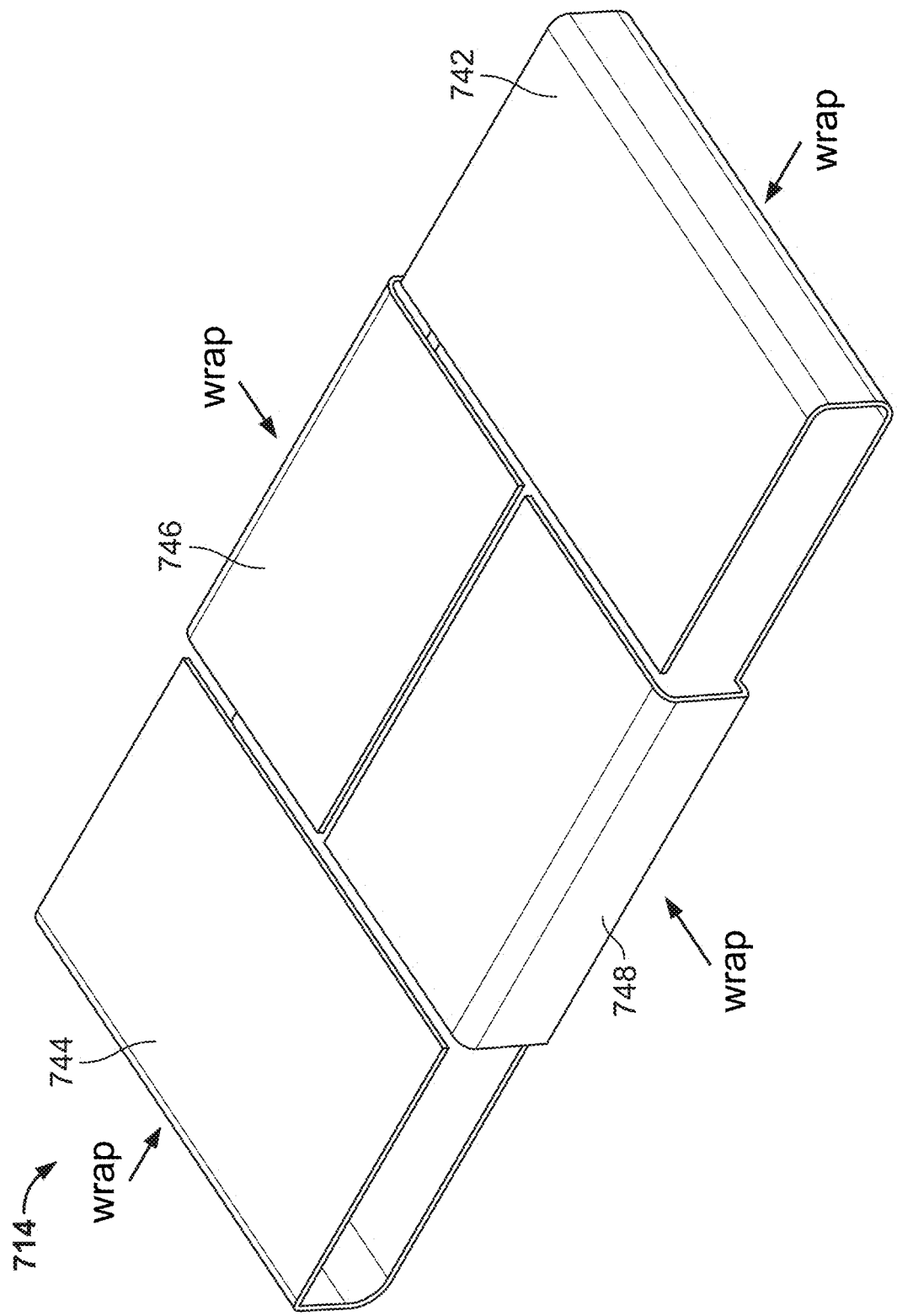
FIG. 17 is a perspective view of the wrapped graphite sheet from FIG. 16 shown without the thermal management assembly or transceiver.
Figure 21:
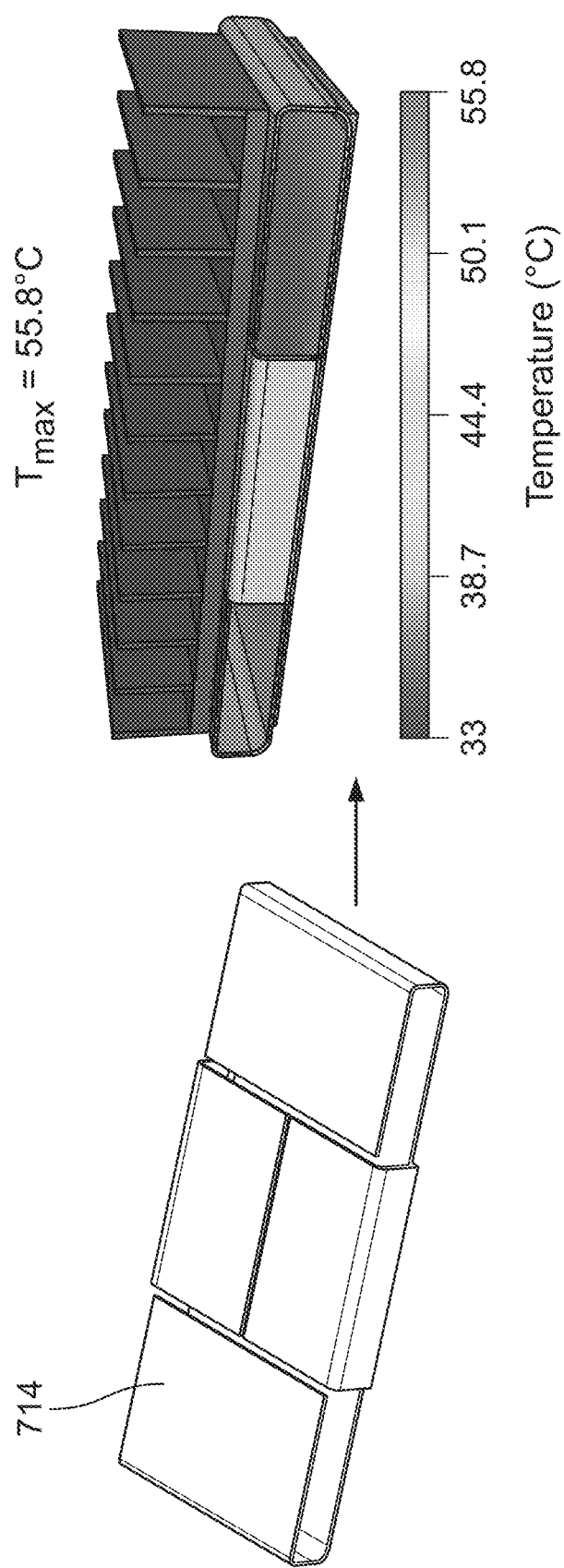
FIG. 21 illustrates the thermal simulation results using the model shown in FIG. 18 along with the graphite sheet having portions wrapped in two non-parallel directions according to the illustrated embodiment shown in FIGS. 16 and 17.

FIG. 21 illustrates the thermal simulation results using the model shown in FIG. 18 along with the single graphite sheet 714 having portions wrapped in two non-parallel directions according to the illustrated embodiment shown in FIGS. 16 and 17. As shown in FIG. 21, the maximum temperature of the integrated circuit (broadly, heat source) was 65.8 degrees Celsius (° C.).

Generally, a comparison of FIGS. 19, 20, and 21 shows the thermal performance improvement and lower maximum temperatures achievable by using graphite to define multiple heat paths (e.g., FIGS. 12-17, etc.), which improve thermal spreading.

In an exemplary embodiment, a transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) includes a cage (broadly, a housing) (e.g., an SFP cage, etc.) adapted to receive a connector (e.g., an SFP cable connector, other cable connector, etc.). At least one of a thermal interface material and a thermoelectric module is generally between a side (e.g., a top side, another side, etc.) of the cage and an external heat sink. At least one spring contact is coupled to the side of the cage generally between the connector and the at least one of a thermal interface material and a thermoelectric module. The at least one spring contact and the at least one of a thermal interface material and a thermoelectric module define at least a portion of a thermally-conductive heat path between the connector and the external heat sink.

The at least one spring contact may include at least four spring contacts each coupled to the side of the cage generally between the connector and the thermal interface material and/or a thermoelectric module.

The transceiver may further comprise a metal plate coupled to the at least one spring contact. The metal plate may be substantially parallel to the side of the cage and in contact with the connector received in the cage to thereby define a thermally-conductive heat path between the connector and the at least one spring contact. The transceiver may further comprise graphite wrapped generally around at least a portion of the at least one spring contact and the metal plate. The side of the cage may include an opening. The metal plate may be positioned within the opening such that the metal plate and/or the at least one spring contact thereby define at least a portion of the side of the cage.

The transceiver may further comprise a label disposed on the cage. The label may comprise graphite and include indicia related to the transceiver.

The at least one spring contact may be coupled to the top of the cage via a laser weld.

In an exemplary embodiment, the at least one of a thermal interface material and a thermoelectric module is a thermoelectric module.

In another exemplary embodiment, the at least one of a thermal interface material and a thermoelectric module is a thermal interface material. The transceiver may further comprise a thermally-conductive and electrically-conductive material wrapped around at least a portion of the thermal interface material for conducting heat from the cage and for electrically grounding the cage. The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance. The thermal interface material may include a ceramic and/or boron nitride filled silicone elastomer. The thermal interface material may include a surface treated such that the thermally-conductive and electrically-conductive material is adherable to silicone elastomer.

In another exemplary embodiment, a transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) includes a cage (broadly, a housing) (e.g., a small form-factor pluggable cage, etc.) adapted to receive a connector (e.g., a small form-factor pluggable cable connector, other cable connector, etc.). A thermal interface material is generally between a side (e.g., a top side, another side, etc.) of the cage and an external heat sink. A thermally-conductive and electrically-conductive material is wrapped around at least a portion of the thermal interface material. The thermal interface material and the thermally-conductive and electrically-conductive material define at least a portion of a thermally-conductive heat path between the cage and the external heat sink. The thermally-conductive and electrically-conductive material wrapped around at least a portion of the thermal interface material is operable for electrically grounding the cage.

The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance. The thermally-conductive and electrically-conductive material wrapped around at least a portion of the thermal interface material may have a thickness of less than about one hundred micrometers. The thermal interface material may include a ceramic and/or boron nitride filled silicone elastomer. The thermal interface material may include a surface treated such that the thermally-conductive and electrically-conductive material is adherable to silicone elastomer.

In a further exemplary embodiment, a transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) includes a cage (broadly, a housing) (e.g., a small form-factor pluggable cage, etc.) adapted to receive a connector (e.g., a small form-factor pluggable cable connector, other cable connector, etc.). A thermal interface material is generally between a side (e.g., a top side, another side, etc.) of the cage and an external heat sink. A thermally-conductive and electrically-conductive material is wrapped around at least a portion of the thermal interface material. At least one spring contact is coupled to the side of the cage generally between the connector and the thermal interface material.

The at least one spring contact, the thermal interface material, and the thermally-conductive and electrically-conductive material may define at least a portion of a thermally-conductive heat path between the connector and the external heat sink. The thermally-conductive and electrically-conductive material wrapped around at least a portion of the thermal interface material may be operable for electrically grounding the cage.

The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance.

The transceiver may further comprise a thermoelectric module coupled to the thermal interface material.

The transceiver may further comprise a metal plate coupled to the at least one spring contact. The metal plate may be substantially parallel to the side of the cage and in contact with the connector received in the cage to thereby define a thermally-conductive heat path between the connector and the at least one spring contact. The transceiver may further comprise graphite wrapped generally around at least a portion of the at least one spring contact and the metal plate. The side of the cage may include an opening. The metal plate may be positioned within the opening such that the metal plate and/or the at least one spring contact thereby define at least a portion of the side of the cage.

Also disclosed are methods and assemblies for transferring heat from a heat source such as a connector (e.g., a small form-factor pluggable cable connector, other cable connector, etc.) within a housing or cage (e.g., a small form-factor pluggable cage, etc.), etc. of a device, such as a transceiver (e.g., small form-factor pluggable (SFP) transceiver, SFP+ transceiver, quad small form-factor pluggable (QSFP) transceiver, QSFP+ transceiver, XFP transceiver, other devices besides transceivers, etc.), etc. In an exemplary embodiment, an assembly includes at least one of a thermal interface material and a thermoelectric module and at least one spring contact positionable generally between the connector and the at least one of a thermal interface material and a thermoelectric module. The at least one of a thermal interface material and a thermoelectric module is positionable between the at least one spring contact and an external heat sink for transferring heat from the cage to the external heat sink. The at least one spring contact the thermal interface material and/or a thermoelectric module are operable for defining at least a portion of a thermally-conductive heat path between the connector and the external heat sink.

The at least one spring contact may include at least four spring contacts.

The assembly may further comprise a metal plate coupled to the at least one spring contact. The metal plate may be configured to be substantially parallel to the side of the cage and in contact with the connector received in the cage to thereby define a thermally-conductive heat path between the connector and the at least one spring contact. The assembly may further comprise graphite wrapped generally around at least a portion of the at least one spring contact and the metal plate.

A small form-factor pluggable transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) may include the assembly, a small form-factor pluggable cage (broadly, a housing), and a small form-factor pluggable cable connector (broadly, a connector) within the cage. A side (e.g., a top side, another side, etc.) of the cage may include an opening. The metal plate may be positioned within the opening such that the metal plate and/or the at least one spring contact thereby define at least a portion of the side of the cage.

In an exemplary embodiment, the at least one of a thermal interface material and a thermoelectric module is a thermoelectric module.

In another exemplary embodiment, the at least one of a thermal interface material and a thermoelectric module is a thermal interface material. The assembly may further comprise a thermally-conductive and electrically-conductive material wrapped around at least a portion of the thermal interface material for conducting heat from the cage and for electrically grounding the cage. The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance. The thermal interface material may include a ceramic and/or boron nitride filled silicone elastomer. The thermal interface material may include a surface treated such that the thermally-conductive and electrically-conductive material is adherable to silicone elastomer.

In a further exemplary embodiment, an assembly includes a thermal interface material positionable generally between a side (e.g., a top side, another side, etc.) of the cage and an external heat sink. A thermally-conductive and electrically-conductive material is wrapped around at least a portion of the thermal interface material. The thermal interface material and the thermally-conductive and electrically-conductive material are operable for defining at least a portion of a thermally-conductive heat path between the cage and the external heat sink. The thermally-conductive and electrically-conductive material wrapped around at least a portion of the thermal interface material is operable for electrically grounding the cage.

The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance.

withstand more than 10,000 times bending with radius of 6 millimeters. Table 1 below includes additional details about Tgon™ 9000 series graphite sheets.

TABLE 1

| Product Name | | Test Method | Tgon 9017 | Tgon 9025 | Tgon 9040 | Tgon 9070 | Tgon 9100 |
|---|---|---|---|---|---|---|---|
| Thickness (mm) | | ASTM D374 | 0.017 +/− 0.005 | 0.025 +/− 0.005 | 0.04 +/− 0.005 | 0.07 +/− 0.001 | 0.1 +/− 0.01 |
| Thermal conductivity (W/mK) | X, Y direction | ASTM E1461 | 1650~1900 | 1500~1700 | 1150~1400 | 700~1000 | 500~700 |
| | Z direction | | 15 | 15 | 15 | 15 | 15 |
| Thermal diffusivity (cm²/s) | | ASTM E1461 | 9 | 9 | 8 | 7 | 7 |
| Density (g/cm³) | | ASTM D792 | 2.05~2.25 | 2.05~2.25 | 1.65~1.85 | 1.0~1.3 | 0.7~1.0 |
| Specific heat (50° C.)(J/gK) | | ASTM E1269 | 0.85 | 0.85 | 0.85 | 0.85 | 0.85 |
| Heat resistance (° C.) | | Over 100 hours of testing | 400 | 400 | 400 | 400 | 400 |
| Extensional strength (MPa) | X, Y direction | ASTM F152 | 39 | 28 | 23 | 20 | 19.2 |
| | Z direction | | 0.1 | 0.4 | 0.4 | 0.4 | 0.65 |
| Bending test(times) (RS/180°) | | ASTM D2176 | 10,000 or more | 10,000 or more | 10,000 or more | 10,000 or more | 10,000 or more |
| Electric conductivity (S/cm) | | ASTM E1269 | 20000 | 20000 | 20000 | 96000 | 96000 |

The thermally-conductive and electrically-conductive material wrapped around at least a portion of the thermal interface material may have a thickness of less than about one hundred micrometers.

The thermal interface material may include a ceramic and/or boron nitride filled silicone elastomer. The thermal interface material may include a surface treated such that the thermally-conductive and electrically-conductive material adherable to silicone elastomer.

A small form-factor pluggable transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) may include the assembly, a small form-factor pluggable cage (broadly, a housing), and a small form-factor pluggable cable connector (broadly, a connector) within the cage. The thermal interface material and the thermally-conductive and electrically-conductive material may define a thermally-conductive heat path between the cage and an external heat sink. The thermally-conductive and electrically-conductive material wrapped around at least a portion of the thermal interface material may electrically ground the cage.

In exemplary embodiments that include one or more graphite sheets, the graphite sheet(s) may include one or more Tgon™ 9000 series graphite sheets. Tgon™ 9000 series graphite sheets comprise synthetic graphite thermal interface materials having a carbon in-plane mono-crystal structure and that are ultra-thin, light-weight, flexible and offer excellent in-plane thermal conductivity. Tgon™ 9000 series graphite sheets are useful for a variety of heat spreading applications where in-plane thermal conductivity dominates and in limited spaces. Tgon™ 9000 series graphite sheets may have a thermal conductivity from about 600 to about 1900 W/mK, may help reduce hot spots and protect sensitive areas, may enable slim device designs due to the ultra-thin sheet thickness of about 17 micrometers to 25 micrometers, may be bight weight with density from about 2.05 g/cm³ to 2.25 g/cm³, may be flexible and able to Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific numerical dimensions and values, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter may be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal management assembly for transferring heat from a device including a housing, the thermal management assembly comprising at least one flexible heat spreading material including portions wrapped around corresponding portions of a part that is configured to be coupled to and/or along a side of the housing, whereby the at least one flexible heat spreading material is operable for defining at least a portion of a thermally-conductive heat path around the corresponding portions of the part, wherein the part includes opposite first and second end portions and a third portion generally between the opposite first and second end portions, and wherein the flexible heat spreading material includes:
   first and second portions wrapped generally around the respective first and second end portions of the part; and
   third and fourth portions wrapped generally around the third portion of the part.

2. The thermal management assembly of claim 1, wherein:
   the first and second portions of the flexible heat spreading material respectively include opposite first and second ends spaced apart from each other along an upper surface of the part; and
   the third and fourth portions of the flexible heat spreading material respectively include opposite third and fourth ends spaced apart from each other along the upper surface of the part.

3. The thermal management assembly of claim 1, wherein the at least one flexible heat spreading material is a single sheet of flexible heat spreading material that integrally includes the portions wrapped around the corresponding portions of the part, and wherein the integral portions of the single sheet of flexible heat spreading material are wrapped in different non-parallel directions around the corresponding portions of the part.

4. The thermal management assembly of claim 1, wherein:
   the first and second portions are wrapped in a first direction generally around the respective first and second end portions of the part; and the third and fourth portions are wrapped generally around the third portion of the part in a second direction non-parallel with the first direction.

5. The thermal management assembly of claim 4, wherein the first and second directions are generally perpendicular to each other.

6. The thermal management assembly of claim 1, wherein the flexible heat spreading material is a single sheet of flexible heat spreading material that integrally includes the first, second, third, and fourth portions.

7. The thermal management assembly of claim 6, wherein the single sheet of flexible heat spreading material comprises synthetic graphite and/or natural graphite.

8. The thermal management assembly of claim 1, wherein the flexible heat spreading material includes a single sheet of graphite that integrally includes:
   the first and second portions wrapped generally around the respective first and second end portions of the part; and
   the third and fourth portions wrapped generally around the third portion of the part.

9. The thermal management assembly of claim 8, wherein:
   the first and second portions are wrapped in a first direction generally around the respective first and second end portions of the part;
   the third and fourth portions are wrapped generally around the third portion of the part in a second direction generally perpendicular to the first direction; and
   the single sheet of graphite comprises synthetic graphite and/or natural graphite.

10. A device comprising the thermal management assembly of claim 1 and the housing, wherein the flexible heat spreading material includes:
    the first and second portions wrapped generally around the respective first and second end portions of the part in a first direction that is generally parallel to a direction in which a connector is slidably insertable into and removable from the housing; and
    the third and fourth portions wrapped generally around the third portion of the part in a second direction that is non-parallel with the direction in which the connector is slidably insertable into and removable from the housing.

11. The device of claim 10, wherein:
    the device is a small form-factor pluggable transceiver; and
    the housing is a small form-factor pluggable cage adapted to receive a small form-factor pluggable cable connector.

12. The device of claim 10, wherein:
    the third and fourth portions are wrapped generally around the third portion of the part in the second direction that is generally perpendicular to the direction in which the connector is slidably insertable into and removable from the housing; and
    the flexible heat spreading material is a single sheet of graphite integrally includes the first, second, third, and fourth portions.

13. A thermal management assembly for transferring heat from a device including a housing, the thermal management assembly comprising at least one flexible heat spreading material including portions wrapped around corresponding portions of a part that is configured to be coupled to and/or along a side of the housing, whereby the at least one flexible heat spreading material is operable for defining at least a portion of a thermally-conductive heat path around the corresponding portions of the part, wherein:
    the part comprises at least one spring contact configured to provide mechanical and/or spring pressure for biasing one or more portions of the flexible heat spreading material against and/or into thermal contact with another surface; and/or
    the part comprises at least one latching member configured to extend downwardly along at least one sidewall of the housing, the latching member including a latching surface and opening to enable latching of the part to corresponding structure along the sidewall of the housing.

14. A thermal management assembly for transferring heat from a device including a housing, the thermal management assembly comprising at least one flexible heat spreading material including portions wrapped around corresponding portions of a part that is configured to be coupled to and/or along a side of the housing, whereby the at least one flexible heat spreading material is operable for defining at least a portion of a thermally-conductive heat path around the corresponding portions of the part, wherein the at least one flexible heat spreading material comprises first and second graphite sheets including the portions that are wrapped around the corresponding portions of the part, whereby the first and second graphite sheets are operable for defining respective first and second thermally-conductive heat paths around the corresponding portions of the part.

15. A thermal management assembly for transferring heat from a device including a housing, the thermal management assembly comprising:
    a first graphite sheet wrapped around at least a portion of a first spring contact configured to be coupled to and/or along a side of the housing, whereby the first graphite sheet is operable for defining a first thermally-conductive heat path around the at least a portion of the first spring contact; and
    a second graphite sheet is wrapped around at least a portion of a second spring contact configured to be coupled to and/or along the side of the housing, whereby the second graphite sheet is operable for defining a second thermally-conductive heat path around the at least a portion of the second spring contact.

16. The thermal management assembly of claim 15, wherein:
    the first graphite sheet is wrapped around at least a portion of a first plate to which the first spring contact is coupled, such that the first graphite sheet is operable for defining the first thermally-conductive heat path from the side of the housing around the at least a portion of the first spring contact and the at least a portion of the first plate; and
    the second graphite sheet is wrapped around at least a portion of a second plate to which the second spring contact is coupled, such that the second graphite sheet is operable for defining the second thermally-conductive heat path from the side of the housing around the at least a portion of the second spring contact and the at least a portion of the second plate.

17. The thermal management assembly of claim 15, wherein the first and second graphite sheets comprise natural graphite and/or synthetic graphite; and wherein the thermal management assembly is configured such that when a connector is received within the housing:
    a portion of the first graphite sheet thermal contacts a first portion of the connector within housing, and the first graphite sheet defines the first thermally-conductive heat path from the first portion of the connector around the at least a portion of the first spring contact; and a portion of the second graphite sheet thermal contacts a second portion of the connector within housing, and the second graphite sheet defines the second thermally-conductive heat path from the second portion of the connector around the at least a portion of the second spring contact.

18. A device comprising the thermal management assembly of claim 15, wherein the device is a small form-factor pluggable transceiver, and the housing is a small form-factor pluggable cage adapted to receive a small form-factor pluggable cable connector.

19. A thermal management assembly for transferring heat from a device including a housing, the thermal management assembly comprising at least one part that is configured to be coupled to and/or along a side of the housing, wherein the thermal management assembly further comprises:

at least one sheet of flexible heat spreading material integrally including portions wrapped in different non-parallel directions around corresponding portions of the part, whereby the at least one sheet of flexible heat spreading material is operable for defining at least a portion of a thermally-conductive heat path around the corresponding portions of the part; and/or multiple sheets of flexible heat spreading material including portions wrapped around corresponding multiple portions of the part, whereby the multiple sheets of flexible heat spreading material are operable for defining multiple thermally-conductive heat paths around the corresponding multiple portions of the part;

wherein:

the part comprises first and second spring contacts; and the thermal management assembly comprises the multiple sheets of flexible heat spreading material that include:

a first graphite sheet wrapped around at least a portion of the first spring contact, whereby the first graphite sheet is operable for defining a first thermally-conductive heat path around the at least a portion of the first spring contact; and a second graphite sheet is wrapped around at least a portion of the second spring contact configured to be coupled to and/or along the side of the housing, whereby the second graphite sheet is operable for defining a second thermally-conductive heat path around the at least a portion of the second spring contact.

20. A thermal management assembly for transferring heat from a device including a housing, the thermal management assembly comprising at least one part that is configured to be coupled to and/or along a side of the housing, wherein the thermal management assembly further comprises:

at least one sheet of flexible heat spreading material integrally including portions wrapped in different non-parallel directions around corresponding portions of the part, whereby the at least one sheet of flexible heat spreading material is operable for defining at least a portion of a thermally-conductive heat path around the corresponding portions of the part; and/or multiple sheets of flexible heat spreading material including portions wrapped around corresponding multiple portions of the part, whereby the multiple sheets of flexible heat spreading material are operable for defining multiple thermally-conductive heat paths around the corresponding multiple portions of the part;

wherein the part includes opposite first and second end portions and a third portion generally between the opposite first and second end portions; and wherein the thermal management assembly comprises the at least one sheet of flexible heat spreading material that is a single sheet of graphite integrally including:

first and second portions wrapped in a first direction generally around the respective first and second end portions of the part; and third and fourth portions are wrapped generally around the third portion of the part in a second direction generally perpendicular to the first direction.

* * * * *